US012787422B2

(12) United States Patent
Yemenicioglu et al.

(10) Patent No.: US 12,787,422 B2
(45) Date of Patent: Nov. 3, 2026

(54) GATE CUT, WITH ASYMMETRICAL CHANNEL TO GATE CUT SPACING

(71) Applicant: Intel Corporation, Santa Clara, CA (US)

(72) Inventors: Sukru Yemenicioglu, Portland, OR (US); Leonard P. Guler, Hillsboro, OR (US); Tahir Ghani, Portland, OR (US); Marni Nabors, Portland, OR (US); Xinning Wang, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 370 days.

(21) Appl. No.: 17/957,821

(22) Filed: Sep. 30, 2022

(65) Prior Publication Data

US 2024/0113107 A1 Apr. 4, 2024

(51) Int. Cl.
*H10D 84/83* (2025.01)
*H10D 30/01* (2025.01)
(Continued)

(52) U.S. Cl.
CPC ........... *H10D 84/83* (2025.01); *H10D 30/014* (2025.01); *H10D 30/43* (2025.01); *H10D 30/47* (2025.01);
(Continued)

(58) Field of Classification Search
CPC ............... H10D 84/83; H10D 84/0128; H10D 84/0151; H10D 84/038; H10D 84/0158;
(Continued)

(56) References Cited

U.S. PATENT DOCUMENTS 9,972,495 B1 * 5/2018 Wu .................. H10D 64/01326
2019/0139955 A1 * 5/2019 Kim .................. H01L 21/76229
(Continued)

FOREIGN PATENT DOCUMENTS

WO 2021009579 A1 1/2021

OTHER PUBLICATIONS

Extended European Search Report received for EP Application No. 23187422.3, dated Feb. 16, 2024. 12 pages.
(Continued)

*Primary Examiner* — Dao H Nguyen
(74) *Attorney, Agent, or Firm* — Arcane Law PLLC

(57) ABSTRACT

An integrated circuit includes a first device and a laterally adjacent second device. The first device includes a first body including semiconductor material extending from a first source region to a first drain region, and a first gate structure on the first body. The second device includes a second body including semiconductor material extending from a second source region to a second drain region, and a second gate structure on the second body. A gate cut including dielectric material is between and laterally separates the first gate structure and the second gate structure. The first body is separated laterally from the gate cut by a first distance, and the second body is separated laterally from the gate cut by a second distance. In an example, the first and second distances differ by at least 2 nanometers. In an example, the first and second devices are fin-based devices or gate-all-around devices.

20 Claims, 12 Drawing Sheets

(51) Int. Cl.

| | |
|---|---|
| ***H10D 30/43*** | (2025.01) |
| ***H10D 30/47*** | (2025.01) |
| ***H10D 30/62*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |
| ***H10W 10/00*** | (2026.01) |
| ***H10W 10/17*** | (2026.01) |

(52) U.S. Cl.

CPC ..... *H10D 30/6735* (2025.01); *H10D 30/6757* (2025.01); *H10D 62/121* (2025.01); *H10D 84/0128* (2025.01); *H10D 84/0151* (2025.01); *H10D 84/038* (2025.01); *H10W 10/014* (2026.01); *H10W 10/17* (2026.01); *H10D 30/024* (2025.01); *H10D 30/6211* (2025.01); *H10D 84/0158* (2025.01); *H10D 84/834* (2025.01)

(58) Field of Classification Search

CPC ............. H10D 84/834; H10D 84/0153; H10D 84/0135; H10D 30/014; H10D 30/43; H10D 30/47; H10D 30/6735; H10D 30/6757; H10D 30/024; H10D 30/6211; H10D 62/121; H10D 64/518; H10W 10/014; H10W 10/17

See application file for complete search history.

(56) References Cited

U.S. PATENT DOCUMENTS

| | | | | |
|---|---|---|---|---|
| 2020/0066725 | A1 | 2/2020 | Bhuwalka et al. | |
| 2022/0037495 | A1 | 2/2022 | Kang et al. | |
| 2022/0173097 | A1* | 6/2022 | Yang | H10D 30/6757 |
| 2023/0061555 | A1* | 3/2023 | Chen | H10D 30/43 |
| 2023/0141523 | A1* | 5/2023 | Chen | H10D 84/0151 257/288 |
| 2023/0411358 | A1* | 12/2023 | Xie | H10D 64/017 |
| 2023/0411386 | A1* | 12/2023 | Xie | H10D 84/83 |
| 2023/0420505 | A1* | 12/2023 | Chen | H10D 84/0151 |
| 2024/0008242 | A1* | 1/2024 | Xie | H10D 89/10 |
| 2024/0064951 | A1* | 2/2024 | Chu | H10D 84/038 |

OTHER PUBLICATIONS

Jin, Hao and Qi, Yuejing, "Review of overlay error and controlling methods in alignment system for advanced lithography," Thirteenth International Conference on Information Optics and Photonics, (2022) SPIE, vol. 12478.pp. 1247843-1 to 1247843-16.

* cited by examiner

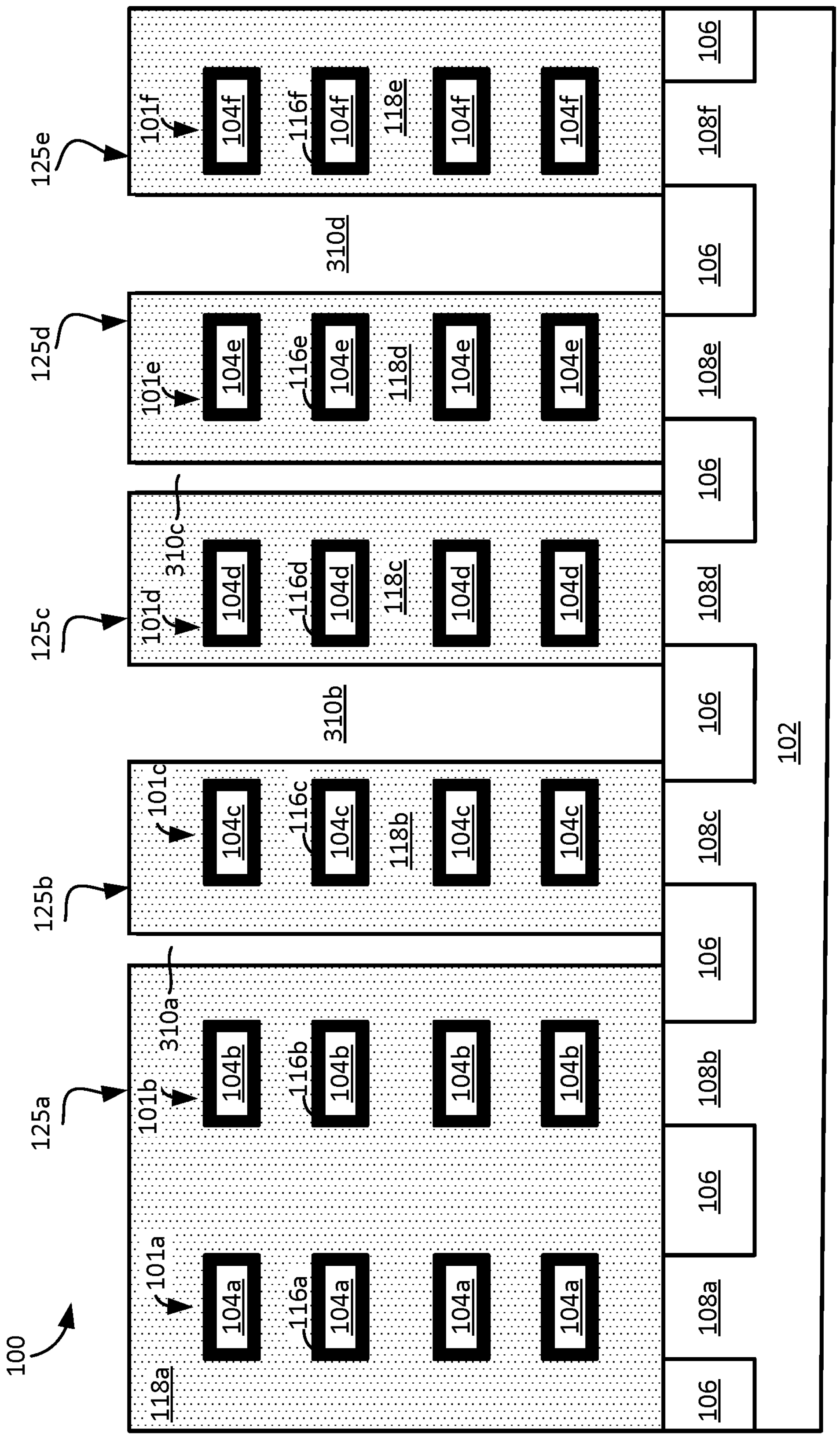
FIG. 3D
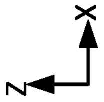

GATE CUT, WITH ASYMMETRICAL CHANNEL TO GATE CUT SPACING

FIELD OF THE DISCLOSURE

The present disclosure relates to integrated circuits, and more particularly, to transistor devices having gate cuts.

BACKGROUND

As integrated circuits continue to scale downward in size, a number of challenges arise. For instance, reducing the size of memory and logic cells is becoming increasingly more difficult, as is reducing inter-device spacing at the device layer. A gate cut structure comprising dielectric material isolates gate structures of two adjacent transistor devices, and is formed between the two adjacent transistor devices. As transistors are packed more densely, the formation of certain device structures used to isolate adjacent transistors (such as a gate cut structure) becomes challenging. Accordingly, there remain a number of non-trivial challenges with respect to forming semiconductor devices.

BRIEF DESCRIPTION OF THE DRAWINGS

FIGS. 3A, 3B, 3C, 3D, and 3E collectively illustrate cross-sectional views of an integrated circuit structure in various stages of processing in accordance with the methodology of FIG. 2, in accordance with an embodiment of the present disclosure.

Figure 1A:
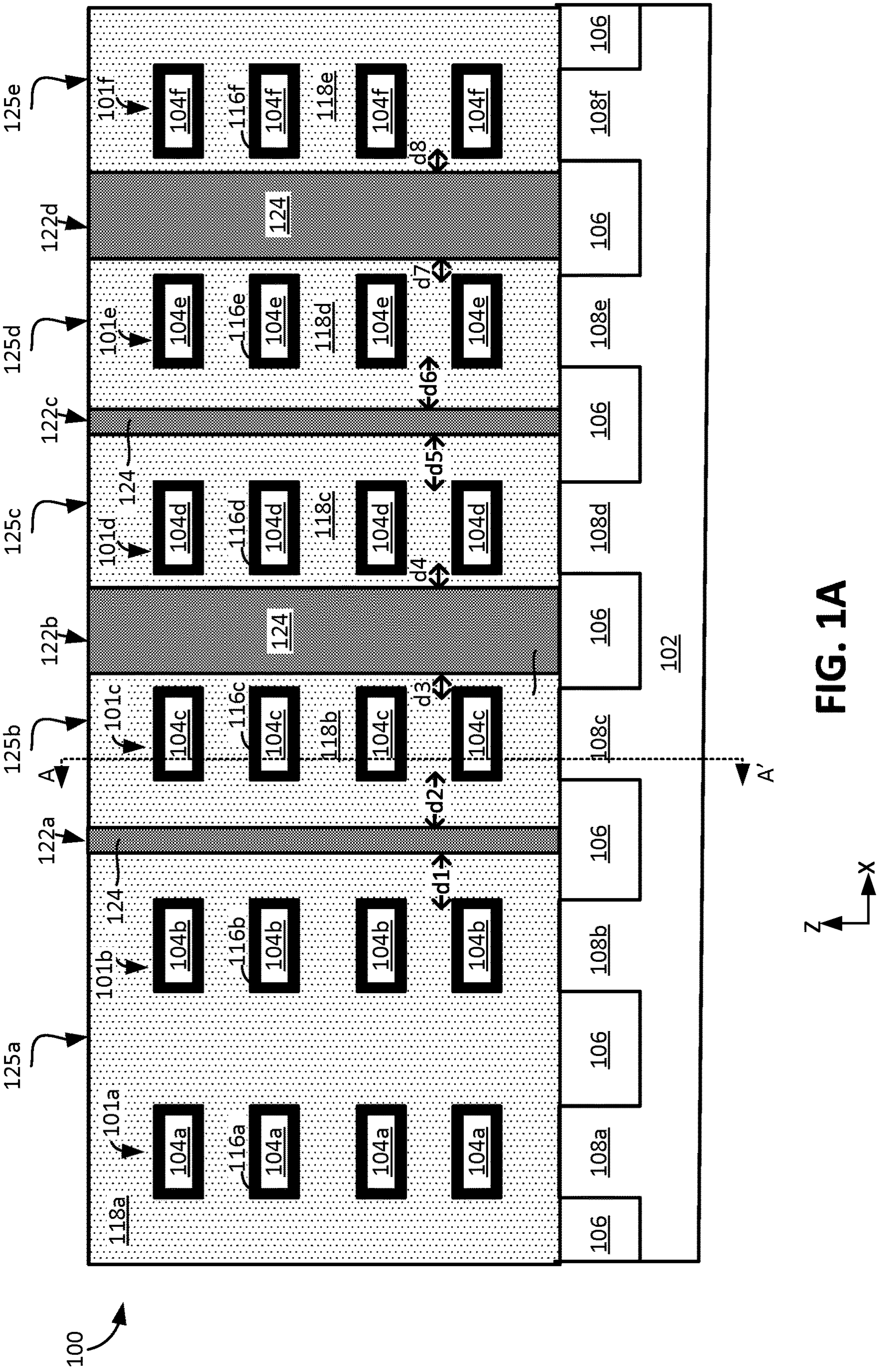
FIGS. 1A and 1B illustrate cross-sectional views of an integrated circuit structure comprising semiconductor devices, wherein a first gate cut of the structure is at a first distance d2 from a first channel region of a first device that is immediate adjacent to the first gate cut, wherein a second gate cut of the structure is at a second distance d3 from the first channel region of the first device that is immediate adjacent to the second gate cut, where the first and second distances d2 and d3 differ by at least 2 nm, according to an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Techniques are provided herein to form semiconductor devices that include one or more gate cuts that are placed asymmetrically relative to immediate adjacent channel regions. For example, a gate cut may be at a first distance from channel regions of an immediate adjacent device on a first side, and may be at a second distance from channel regions of another immediate adjacent device on an opposing second side, where the first and second distances differ by at least 2 nm. In an example, the gate cut may be in contact with gate dielectric wrapping around the channel regions of a device, or may even be in contact with the channel regions of the device. The techniques can be used in any number of integrated circuit applications and are particularly useful with respect to device layer transistors, such as finFETs or gate-all-around (GAA) transistors (e.g., where the channel regions comprise nanoribbons, nanowires, or nanosheets).

In one embodiment, an integrated circuit comprises a first semiconductor device, and a laterally adjacent second semiconductor device. The first semiconductor device comprises (i) a first source region, (ii) a first drain region, (iii) a first body comprising semiconductor material extending in a first direction from the first source region to the first drain region, and (iv) a first gate structure extending in a second direction and on the first body. The second semiconductor device comprises (i) a second source region, (ii) a second drain region, (iii) a second body comprising semiconductor material extending in the first direction from the second source region to the second drain region, and (iv) a second gate structure extending in the second direction and on the second body. A gate cut is laterally between and separates the first gate structure and the second gate structure, where the gate cut comprises dielectric material. The first body is separated laterally from the gate cut by a first distance, and the second body is separated laterally from the gate cut by a second distance. In an example, the first and second distances differ by at least 2 nanometers (nm). In an example, the first and second semiconductor devices are fin-based devices or gate-all-around devices.

In another embodiment, an integrated circuit comprises a semiconductor device including (i) a source region, (ii) a drain region, (iii) a body comprising semiconductor material extending laterally from the source region to the drain region, and (iv) a gate structure on the body. In an example, the gate structure is laterally between and in contact with a first gate cut of a first side, and a second gate cut on an opposing second side. The first and second gate cuts comprise dielectric material. In an example, no other semiconductor device is laterally between the semiconductor device and the first gate cut, and laterally between the semiconductor device and the second gate cut. The body is separated laterally from (i) the first gate cut by a first distance and (ii) the second gate cut by a second distance. In an example, the first and second distances differ by at least 2 nanometers (nm).

In yet another embodiment, an integrated circuit comprises laterally adjacent first device, second device, third device, and fourth device. The first device includes a first body comprising semiconductor material, and the second device includes a second body comprising semiconductor material. A first continuous gate structure is on both the first body and the second body. The third device includes (i) a third body comprising semiconductor material, and (ii) a second gate structure on the third body. The fourth device includes (i) a fourth body comprising semiconductor material, and (ii) a third gate structure on the fourth body. The first gate structure is laterally between the second and third gate structures. A first structure comprising dielectric material is laterally between the first and second gate structures, with no intervening device laterally between the first device and the first structure. A second structure comprising dielectric material is laterally between the first and third gate structures, with no intervening device laterally between the second device and the second structure. The first body is separated laterally from the first structure by a first distance and the second body is separated laterally from the second structure by a second distance. In an example, the first and second distances differ by at least 2 nm. In an example, the first, second, third, and fourth devices are fin-based devices or gate-all-around devices. Numerous configurations and variations will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. Example structures like gate cuts are used in integrated circuit design to isolate gate structures from one another. For example, during initial stages of formation of an integrated circuit structure (e.g., after the replacement metal gate processes, where dummy gates are replaced by metal gates), a common gate structure may be on channel regions of a first and a laterally adjacent second devices, where the common gate structure comprises gate dielectric material on channel regions of each of the first and second devices, and a common and continuous gate electrode on the gate dielectric material. A gate cut comprising dielectric material cuts through the common gate structure, to divide the common gate structure into (i) a first gate structure that is on channel regions of the first device, and (ii) a separate second gate structure that is on channel regions of the second device. In an example where the devices are gate-all-around (GAA) devices (e.g., comprising nanoribbons, or nanowires, or nanoribbons as channel regions) or fin-based devices (such as finFET devices), the gate cut is implemented such that sufficient portion of the first gate structure is between the channel regions of the first device and the gate cut, and sufficient portion of the second gate structure is between the channel regions of the second device and the gate cut. This way, the first gate structure fully (e.g., for GAA devices) or at least partially (e.g., for finFET devices) wraps around the channel regions of the first device, and similarly, the second gate structure fully or at least partially wraps around the channel regions of the second device. Such design ensures better control of the first and second gate structures on the channel regions of the first and second devices, respectively.

Note that there may be placement error in placing one or more masks used for forming the gate cut, and consequently, the gate cut may be slightly shifted towards one of the first or second devices. However, the channel regions of the first and second devices are designed to be sufficiently narrow and/or apart from each other, and/or the gate cut width is designed to be sufficiently narrow, e.g., to ensure that even in an event of some lateral shift of the gate cut structure, there is always some portion of the first gate structure between the channel regions of the first device and the gate cut, and there is always some portion of the second gate structure between the channel regions of the second device and the gate cut. Accordingly, for such designs, the channel widths may be made relatively small and/or overall structure dimensions may be made relatively larger, thereby sacrificing device performance (e.g., due to lower width channel) and/or device footprint (e.g., due to increase in overall dimensions).

Thus, and in accordance with an embodiment of the present disclosure, techniques are provided herein to design gate cuts that may be close to the channel regions of immediate adjacent devices. For example, ideally, the gate cut is to be at sufficient distance from channel regions of two adjacent devices on two sides of the gate cut. However, edges of the margin of error for placement of the masks for the gate cut is made to be sufficiently close to the adjacent channel regions (e.g., see margin of error L in FIG. 3B), such that the gate cut may now be shifted to be arbitrarily close to the channel regions of an immediate adjacent device. Thus, for example, the gate cut is separated from a channel region of the first device on a first side by a distance of d3, and the gate cut is separated from a channel region of the second device on a second side by a distance of d4 (e.g., see FIG. 1A). As discussed, for example, one of the distances d3 or d4 may be less than 10 nm, or less than 8 nm, or less than 6 nm, or less than 5 nm, or less than 4 nm, or less than 3 nm, or less than 2 nm, or less than 1 nm, or less than 0.5 nm, or may be even 0 nm (e.g., in which case the channel region is in contact with the gate cut, see FIG. 1E), for example. Thus, in an example, the distances d3 and d4 may be asymmetrical (e.g., due to the shifting of the gate cut, as a consequence of gate cut mask placement error, see FIG. 1C where these distances are denoted as d3' and d4'), where these distances can differ by at least 1 nm, or at least 2 nm, or at least 4 nm, or at least 6 nm, or at least 8 nm, or at least 10 nm, or at least 12 nm, for example.

In an example when the gate cuts are placed at their intended or nominal positions (e.g., see FIG. 1A), a first gate cut may be at a distance d1 from an immediate adjacent channel region, and a second gate cut may be at a distance d3 from an immediate adjacent channel region, where the distances d1 and d3 may differ by at least 1 nm, or at least 2 nm, or at least 4 nm, or at least 6 nm, or at least 8 nm, or at least 10 nm, or at least 12 nm, for example. Thus, the gate cuts may not be designed to be placed at same distances from the adjacent channel regions. In the example of FIG. 1A, the distance d3 is smaller than distance d1, where distance d3 represents a margin for edge placement error (EPE), e.g., a maximum distance by which the edge of the corresponding gate cut can shift, without the gate cut cutting through an adjacent channel region.

In an example, in a GAA device, for a gate structure to have sufficient control over corresponding channel regions (e.g., comprising nanoribbons, nanowires, or nanosheets), the gate electrode (e.g., including the work function material that is part of the gate electrode) of the gate structure may wrap around the middle portions of individual nanoribbons. Similarly, in a finFET device, the gate electrode of the gate structure may be on three sides of the fin. However, in an example, the gate electrode being on one or more sides of the channel region may be sufficient to impart enough gate control on the channel regions of the GAA or finFET devices. Thus, if the above distance d3, for example, is sufficiently less (examples values of d3 is discussed above), then there may not be sufficient portion of gate electrode between the channel region of the first device and the gate cut. Due to the lack of the sufficient portion of gate electrode between the channel region of the first device and the gate cut, the first gate structure may lose some control of the channel region. However, as the gate electrode of the first gate structure is still on various other sides of the channel region of the first device, the gate electrode of the first gate structure may still impart sufficient control of the channel region of the first device, for satisfactory operation of the first device.

Figure 1B:
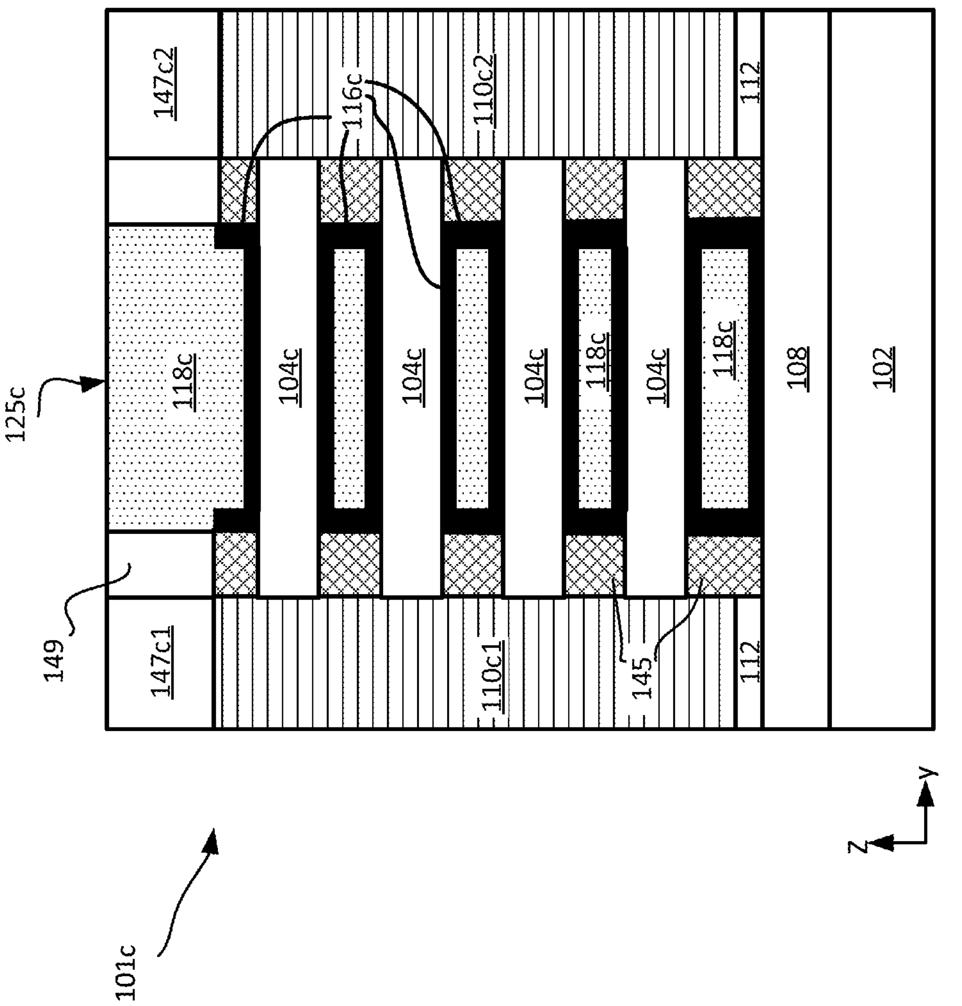
Figure 1C:
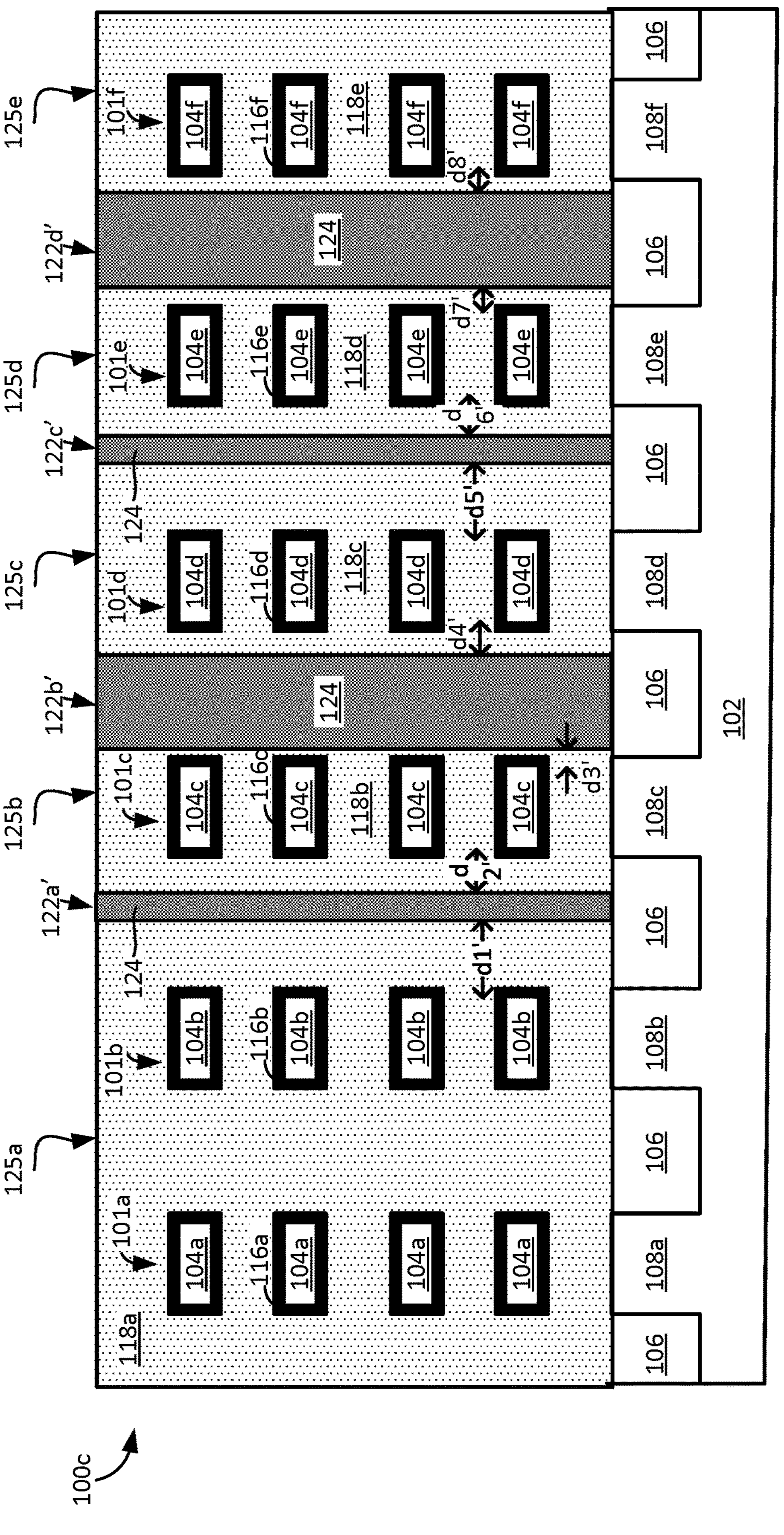
FIG. 1C illustrates cross-sectional view of another integrated circuit structure that is at least in part similar to the integrated circuit structure of FIGS. 1A and 1, and where a gate cut of the structure of FIG. 1C is placed asymmetrically between nanoribbons of two laterally adjacent devices, respectively, according to an embodiment of the present disclosure.
Figure 1D:
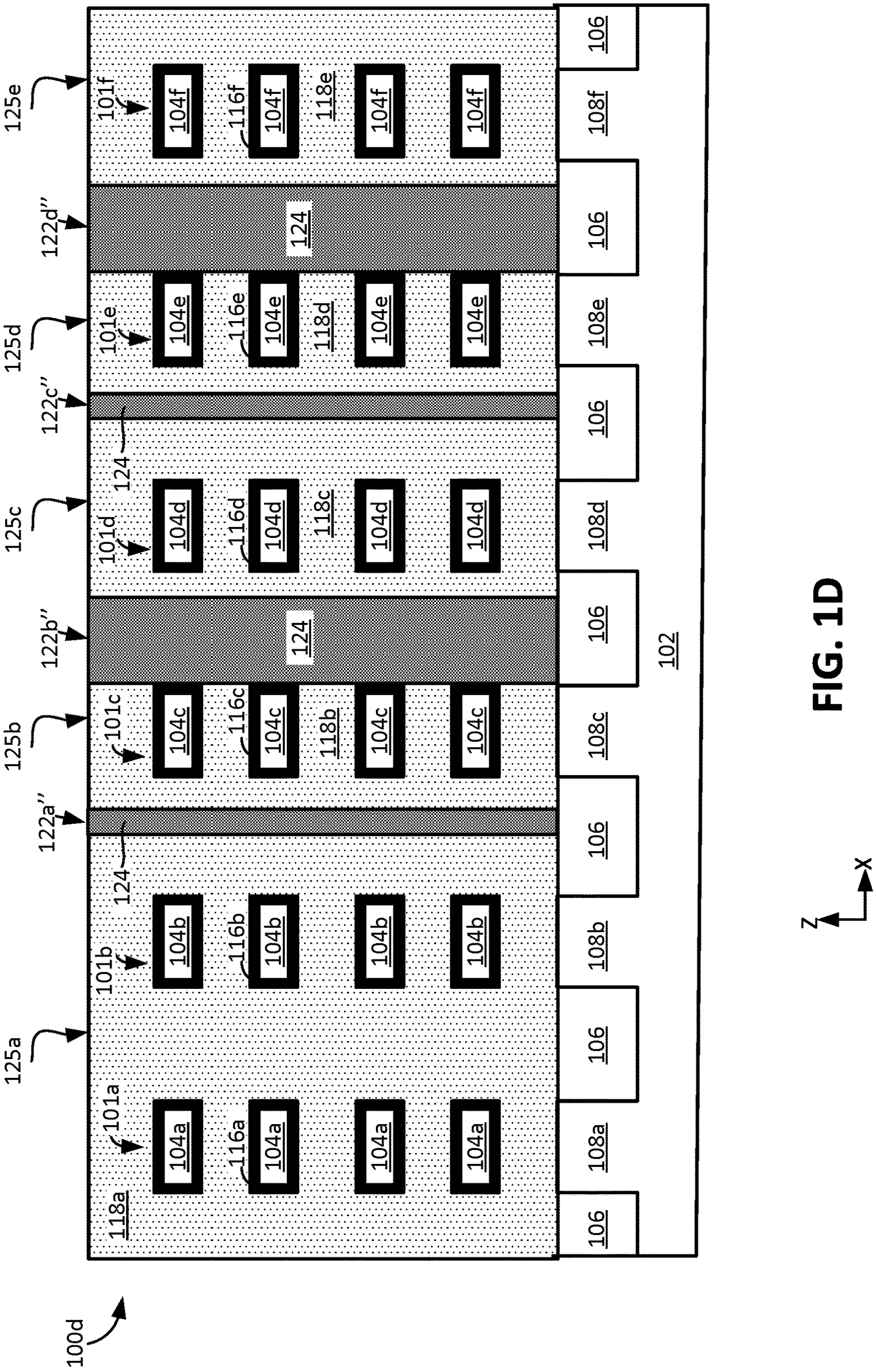
FIG. 1D illustrates cross-sectional view of yet another integrated circuit structure that is at least in part similar to the integrated circuit structure of FIGS. 1A and 1B, and where positions of various gate cuts relative to the nanoribbons in the structure of FIG. 1D are different from positions of corresponding gate cuts relative to the nanoribbons in the structure of FIG. 1A, such that at least one of the gate cuts of the structure of FIG. 1D is in contact with gate dielectric surrounding the nanoribbons of an adjacent device, according to an embodiment of the present disclosure.

For example, if d3 is less than a threshold (e.g., less than 2 nm or 1 nm), the gate dielectric around the channel region of the first device may be in contact with the dielectric material of the gate cut, e.g., see FIG. 1D. In another extreme example where if d3 is substantially zero, the channel region may be in contact with the dielectric material of the gate cut, e.g., see FIG. 1E. As discussed, in some such examples, the first gate structure loses some control of the channel region, due to lack of sufficient gate electrode between the channel region of the first device and the gate cut. However, the first gate structure still has enough control on the channel region, due to the gate electrode being on various other sides of the channel region, for satisfactory operation of the first device.

Figure 3A:
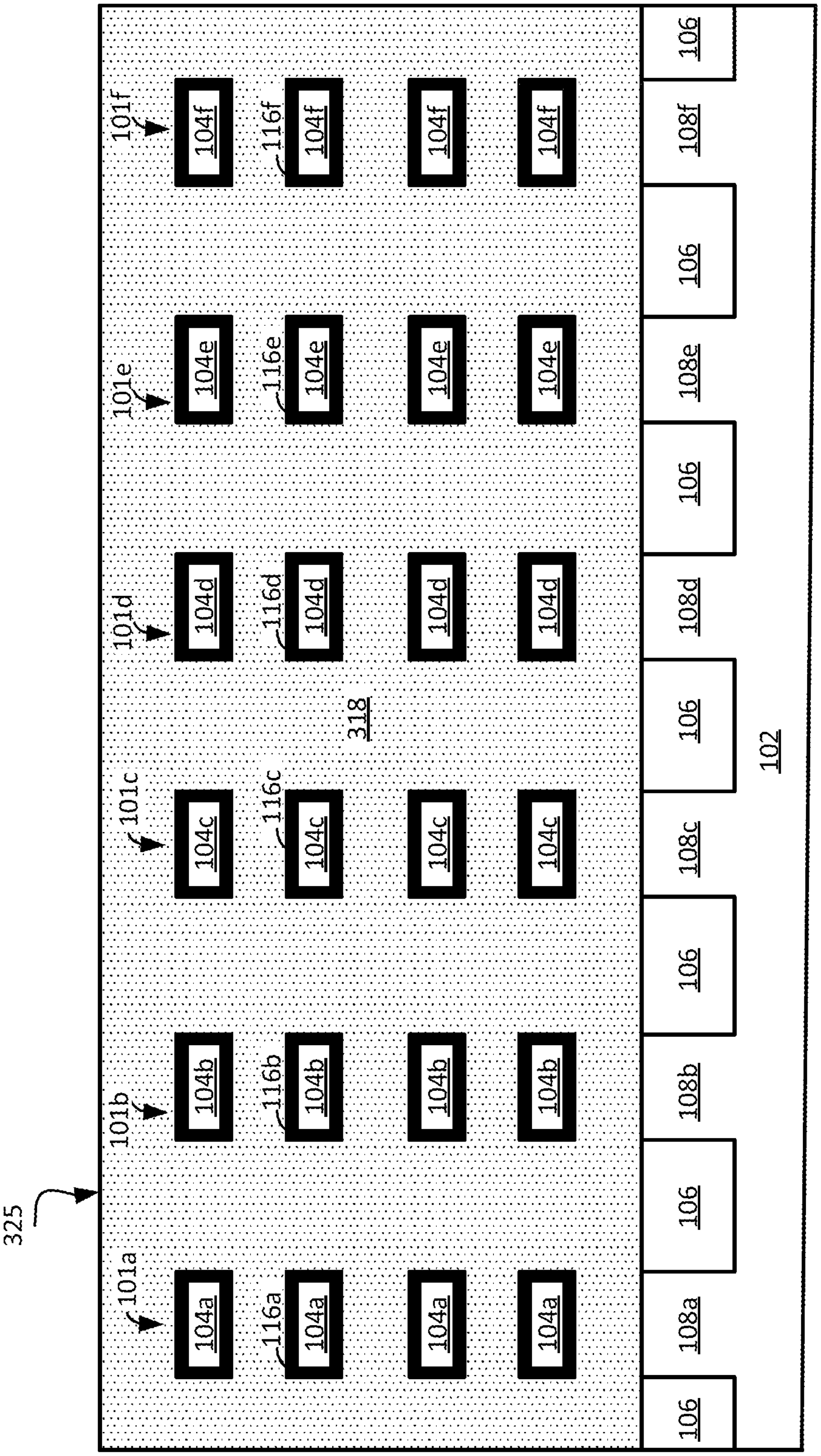
Figure 3B:
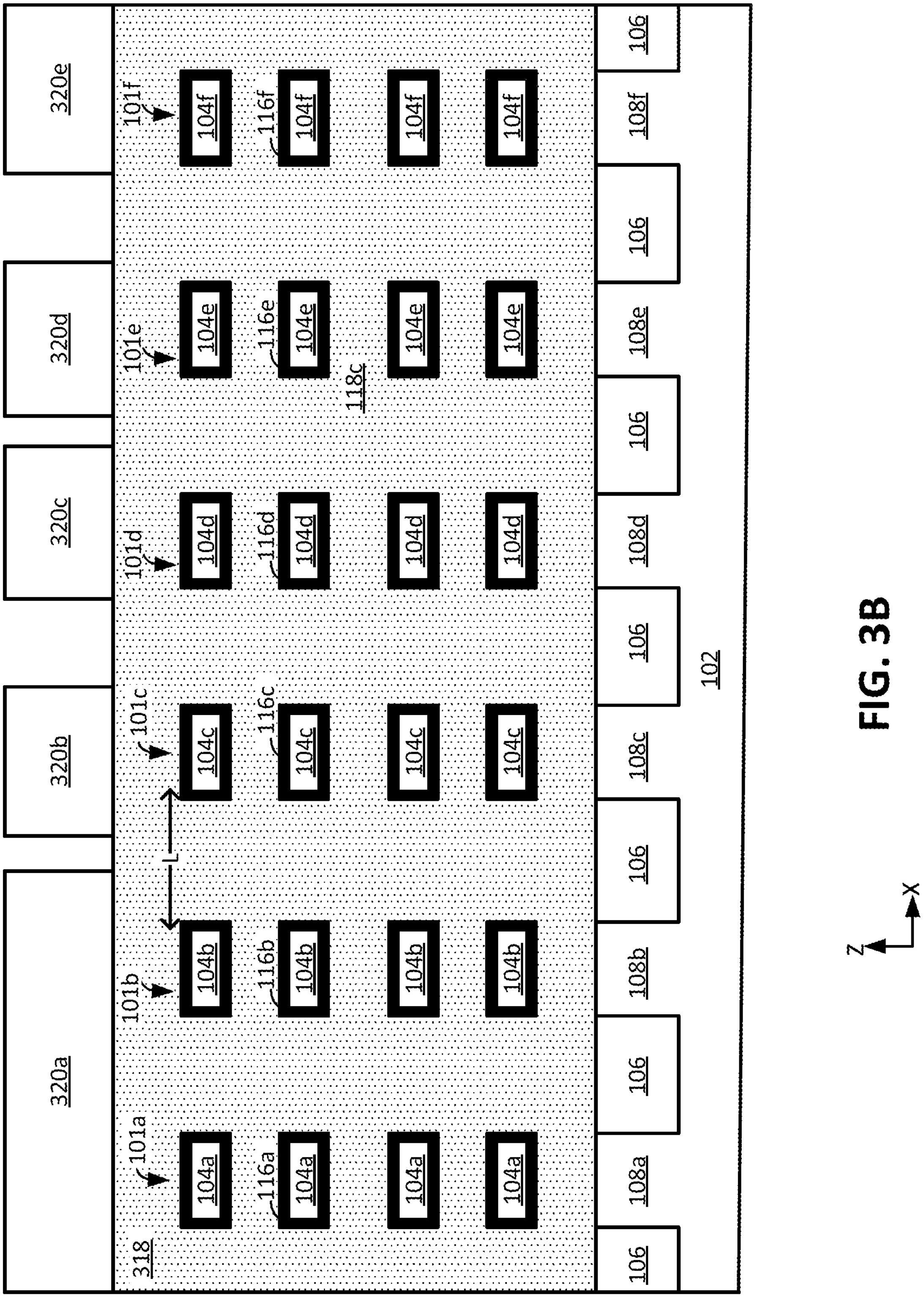

Thus, the techniques discussed herein increases an acceptable margin of error for gate cut mask placement, by moving the edges of margin of error up to the edges of the channel regions of immediate adjacent devices (see FIG. 3B for margin of error L for gate cut mask placement). The additional headroom resulting from the larger acceptable margin of error for gate cut mask placement can be used to make the cross-sectional width w1 of the channel regions (see FIG. 1A for width w1) relatively large. That is, now the channel width w1 can be made relatively large (e.g., wider channels), as the error margin for the gate cut mask placement error is now pushed up to edges of the channel regions. Put differently, there is no reason to have sufficient or threshold lateral gap between each channel region and adjacent gate cuts, and hence, the channel regions (e.g., comprising nanoribbons, nanowires, nanosheets, or fins) can now be made wider, resulting in greater drive current and lower capacitance, leading to improved performance of the devices.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some embodiments, such tools may be used to detect a first transistor device having a first gate structure, a laterally adjacent second transistor device having a second gate structure, and a gate cut comprising dielectric material separating the first and second gate structures, where channel regions of the first transistor device is at a first lateral distance from the gate cut and channel regions of the second transistor device is at a second lateral distance from the gate cut, and where the first and second distances differ by at least 1 nm, or at least 2 nm, or at least 4 nm, or at least 6 nm, or at least 8 nm, or at least 10 nm, or at least 12 nm, for example. In some embodiments, such tools may be also used to detect one of the first or second distances being less than (e.g., at most) 10 nm, or less than 8 nm, or less than 6 nm, or less than 5 nm, or less than 4 nm, or less than 3 nm, or less than 2 nm, or less than 1 nm, or less than 0.5 nm, or is 0 nm (e.g., in which case the corresponding channel regions is in contact with the dielectric material of the gate cut), for example. Numerous configurations and variations will be apparent in light of this disclosure.

Architecture

FIGS. 1A and 1B illustrate cross-sectional views of an integrated circuit structure 100 comprising semiconductor devices 101*a*, 101*b*, 101*c*, 101*d*, 101*e*, and 101*f*, wherein a first gate cut 122*a* of the structure 100 is at a first distance d2 from a channel region 104*c* of the device 101*c* that is immediate adjacent to the first gate cut 122*a*, wherein a second gate cut 122*b* of the structure 100 is at a second distance d3 from the channel region 104*c* of the device 101*c* that is immediate adjacent to the second gate cut 122*b*, where the first and second distances d2 and d3 differ by at least 2 nm, according to an embodiment of the present disclosure.

The cross-sectional view of FIG. 1A is taken across the gate trench of the semiconductor devices, and illustrates cross-sectional views of the channel regions 104. The cross-sectional view of FIG. 1B is along a line A-A' of FIG. 1A that passes through the device 101*c*, and only the device 101*c* is illustrated in the cross-sectional view of FIG. 1B. Note that the gut cuts 122 are not visible in the cross-sectional view of FIG. 1B.

In an example, each of semiconductor devices 101*a*, . . . , 101*f* may be non-planar metal oxide semiconductor (MOS) transistors, such as tri-gate (e.g., finFET) or gate-all-around (GAA) transistors, although other transistor topologies and types could also benefit from the techniques provided herein. The illustrated embodiments herein use the GAA structure including nanoribbons as channel regions. The term nanoribbon may also encompass other similar GAA channel region shapes such as nanowires or nanosheets. Note that the nanoribbons of a device may be replaced by a fin-based structured in one example, to form a finFET device.

The various illustrated semiconductor devices represent a portion of an integrated circuit that may contain any number of similar semiconductor devices. Thus, although six example devices are illustrated, there may be additional devices. For example, although FIG. 1A illustrates the devices 101*a* and 101*b* being adjacent, there may be one or more other devices between the devices 101*a* and 101*b*.

Each of devices 101*a*, . . . , 101*f* includes corresponding one or more nanoribbons 104*a*, . . . , 104*f*, respectively, that extend parallel to one another along a Y-axis direction of FIG. 1, between source and drain regions 110 (e.g., a first direction into and out of the page in the cross-section view of FIG. 1A). The source and drain regions 110 are illustrated in FIG. 1B. Nanoribbons 104 are one example of semiconductor regions or semiconductor bodies that extend between source and drain regions 110. The semiconductor material of nanoribbons 104 may be formed from substrate 102, in an example. In some embodiments, devices 101*a*, . . . , 101*f* may each include semiconductor regions in the shape of fins that can be, for example, native to substrate 102 (formed from the substrate itself), such as silicon (Si) fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 104 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches. In an example, the nanoribbons 104 comprise an appropriate semiconductor material, such as silicon (Si), silicon germanium (SiGe), or another appropriate semiconductor material.

As can be seen, devices 101 are formed on a substrate 102. Any number of semiconductor devices 101 can be formed on substrate 102, but six are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, a lower portion of (or all of) substrate 102 is removed and replaced with one or more backside interconnect layers to form backside signal and power routing, during a backside process.

As can further be seen, adjacent semiconductor devices are separated by a dielectric fill 106. Dielectric fill 106 provides shallow trench isolation (STI) between any adjacent semiconductor devices. Dielectric fill 106 can be any suitable dielectric material, such as silicon oxide (SiO), silicon nitride (SiN), silicon carbide (SiC), silicon oxycarbide (SiOC), silicon oxycarbonitride (SiOCN), or silicon oxynitride (SiON), for example.

The structure 100 comprises sub-fin regions 108*a*, . . . , 108*f*, such that the devices 104*a*, . . . , 104*f* each include a corresponding sub-fin region 108. According to some embodiments, sub-fin regions 108 comprise the same semiconductor material as substrate 102 and is adjacent to dielectric fill 106. According to some embodiments, nanoribbons 104 (or other semiconductor bodies, such as nanowires, nanosheets, or fin-based structures) extend between source and drain regions 110 (illustrated in FIG. 1B) in the first direction (e.g., along the Y-axis of FIG. 1). For example, nanoribbons 104*a* provide an active channel region for a corresponding transistor device 101*a*, nanoribbons 104*b* provide an active channel region for a corresponding transistor device 101*b*, nanoribbons 104*f* provide an active channel region for a corresponding transistor device 101*f*, and so on.

As illustrated in the cross-sectional view of FIG. 1B, a source region 110*c*1 is on a first side of corresponding nanoribbons 104*c*, and a drain region 110*c*2 is on a second side of corresponding nanoribbons 104*c*, such that the nanoribbons 104*c* extend laterally from the source region 110*cl* to the drain region 110*c*2. Similarly, nanoribbons 104*a* extend laterally from a corresponding source region 110*a*1 to a corresponding drain region 110*a*2, nanoribbons 104*b* extend laterally from a corresponding source region 110*b*1 to a corresponding drain region 110*b*2, and so on, although only the source and drain regions 110*cl*, 110*c*2 of the device 101*c* are illustrated in the cross-sectional view of FIG. 1B.

Note that the source and drain regions are not illustrated in the cross-sectional view of FIG. 1A, as the source or drain regions would be in front or back of the plane of the paper in which the cross-sectional view of FIG. 1A is illustrated.

According to some embodiments, source and drain regions 110 are epitaxial regions that are provided using an etch-and-replace process. In other embodiments source or drain regions 110 could be, for example, implantation-doped native portions of the semiconductor fins or substrate. Any semiconductor materials suitable for source and drain regions can be used (e.g., group IV and group III-V semiconductor materials). Source or drain regions 110 may include multiple layers such as liners and capping layers to improve contact resistance. In any such cases, the composition and doping of source or drain regions 110 may be the same or different, depending on the polarity of the transistors. In an example, for instance, one of the devices 101*a*, . . . , 101*f* is a p-type MOS (PMOS) transistor, an adjacent one of the devices is an n-type MOS (NMOS) transistor, and so on. Any number of source and drain configurations and materials can be used.

In an example, conductive contacts 147*cl* and 147*c*2 are respectively above the source region 110*c*1 and the drain region 110*c*2, as illustrated in the cross-sectional view of FIG. 1B. One or more other source and/or drain regions of the other devices may also have corresponding contacts. The conductive source and drain contacts may be any suitably conductive material, such as one or more metals and/or alloys thereof. In some embodiments, conductive contacts include one or more of the same metal materials as gate electrode, or a different conductive material. Conductive contacts 147 may be any suitably conductive material such as tungsten (W), copper (Cu), ruthenium (Ru), cobalt (Co), titanium (Ti), molybdenum (Mo), or any alloys thereof. Contacts 147 may include multiple layers, such as a silicide (e.g., tungsten silicide) and a fill metal (e.g., tungsten).

According to some embodiments, a lower dielectric layer 112 exists beneath source and drain regions 110. Lower dielectric layer 112 can include any suitable dielectric material, such as silicon oxide or silicon nitride, and may be provided to isolate source and drain regions 110 from sub-fin regions 108.

According to some embodiments, individual gate structures 125*a*, 125*b*, 125*c*, 125*d*, 125*e* extend over corresponding nanoribbons 104 along a second direction (e.g., in the direction of the X-axis of FIG. 1A and across the page of FIG. 1A). For example, as illustrated in FIG. 1A, gate structure 125*a* extends over and is on the nanoribbons 104*a*, 104*b* of the devices 101*a*, 101*b*, respectively; gate structure 125*b* extends over and is on the nanoribbons 104*c* of the devices 101*c*; gate structure 125*c* extends over and is on the nanoribbons 104*d* of the devices 101*d*; gate structure 125*d* extends over and is on the nanoribbons 104*e* of the device 101*e*; and gate structure 125*e* extends over and is on the nanoribbons 104*f* of the device 101*f*.

In one embodiment, each gate structure 125 includes a gate dielectric 116 that wraps around middle portions of each nanoribbon 104, and a gate electrode 118 that wraps around the gate dielectric 116. For example, gate structure 125*a* includes gate dielectric 116*a* wrapping around nanoribbons 104*a*, gate dielectric 116*b* wrapping around nanoribbons 104*b*, and gate electrode 118*a*. Similarly, gate structure 125*b* includes gate dielectric 116*c* wrapping around nanoribbons 104*c*, and gate electrode 118*b*, and so on.

In some embodiments, the gate dielectric 116 may include a single material layer or multiple stacked material layers. The gate dielectric 116 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 116 is lanthanum. In some embodiments, the gate dielectric can be annealed to improve its quality when high-k dielectric material is used. In some embodiments, the gate dielectric 116 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer. The gate dielectric 116 is present around middle portions of each nanoribbon, and may also be present over sub-fin 108, and/or on inner sidewalls of the inner gate spacers 145.

The gate electrode 118*a* of the gate structure 125*a* wraps around middle portions of individual nanoribbons 104*a* and 104*b*; the gate electrode 118*b* of the gate structure 125*b* wraps around middle portions of individual nanoribbons 104*c*; the gate electrode 118*c* of the gate structure 125*c* wraps around middle portions of individual nanoribbons 104*d*; the gate electrode 118*d* of the gate structure 125*d* wraps around middle portions of individual nanoribbons 104*e*; and the gate electrode 118*e* of the gate structure 125*e* wraps around middle portions of individual nanoribbons 104*f*. Note that the middle portion of each nanoribbon 104 is between a corresponding first end portion and a second end portion, where the first end portions of the nanoribbons of a stack is wrapped around by corresponding first inner gate spacer 145, and where the second end portions of the nanoribbons of the stack is wrapped around by corresponding second inner gate spacer 145, where the inner gate spacers 145 for the device 101*c* are illustrated in FIG. 1B. Other devices have similar inner gate spacers. Also illustrated in FIG. 1B for the device 101*c* are gate spacers 149 that separate upper portions of the gate electrode 118*c* (or a gate contact above the gate electrode 118*c*) from the conductive source and drain contacts 147*c*1, 147*c*2. Gate spacers 149 can include any suitable dielectric material, such as silicon oxide or silicon nitride.

In one embodiment, one or more work function materials (not illustrated in FIGS. 1A and 1B) may be included around the nanoribbons 104. Note that work function materials are called out separately, but may be considered to be part of the gate electrodes. In this manner, a gate electrode 118 may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons. In still other embodiments, there may be insufficient room for any gate fill material, after deposition of work function material (i.e., a given gate electrode may be all work function material and no fill material). In an example, the gate electrodes 118 may include any sufficiently conductive material, such as a metal, metal alloy, or doped polysilicon. The gate electrodes may include a wide range of materials, such as polysilicon or various suitable metals or metal alloys, such as aluminum, tungsten, titanium, tantalum, copper, cobalt, molybdenum, titanium nitride, or tantalum nitride, for example. Numerous gate structure configurations can be used along with the techniques provided herein, and the present disclosure is not intended to be limited to any particular such configurations.

As discussed herein above, each gate structure 125 also includes two corresponding inner gate spacers 145 that extend along the sides of the gate electrode 118, to isolate the gate electrode 118 from an adjacent source or drain region. The inner gate spacers 145 at least partially surround the end portions of individual nanoribbons. In one embodiment, gate spacers 145 may include a dielectric material, such as silicon nitride, for example.

As further shown in this example, adjacent gate structures are separated along the second direction (e.g., across the page, in the X-axis direction of FIG. 1A) by a corresponding gate cut 122, which acts like a dielectric barrier between gate structures. For example, a gate cut 122*a* laterally separates the gate structures 125*a* and 125*b*, a gate cut 122*b* laterally separates the gate structures 125*b* and 125*c*, a gate cut 122*c* laterally separates the gate structures 125*c* and 125*d*, and a gate cut 122*d* laterally separates the gate structures 125*d* and 125*e*, in an example. Individual gate cuts 122 comprise a corresponding structure of sufficiently insulating material, such as a structure of dielectric material 124. Example dielectric materials 124 for gate cut 122 include silicon nitride (SiN), silicon oxide (SiO), silicon carbide (SiC), silicon oxycarbide (SiOC), silicon oxycarbonitride (SiOCN), or silicon oxynitride (SiON), e.g., include silicon and one or more of oxygen, carbon, or nitrogen. In some cases, gate cuts 122 may include multiple layers of dielectric material, such as a first layer of high-k dielectric material along the outer sidewalls of the gate cut structure, and a second layer or body of low-k dielectric material that fills in the remaining portion of the given gate cut 122. In some examples, gate cuts 122 may include one or more airgaps or voids (e.g., filled with gas such as oxygen and/or nitrogen, or devoid of gas). More generally, a given gate cut 122 may include any number of dielectric layers or bodies, and the overall gate cut structure can vary from one embodiment to the next. In an example, since a gate cut 122 is formed after the formation of the gate structures, gate dielectric 116 are not present along the sidewalls of gate cut 122 within the gate trench. According to some embodiments, gate cut 122 also extends in the first direction (into and out of the page of FIG. 1A, e.g., in the Y-axis direction) such that it may cut across a portion of source or drain regions 110.

In an example, the gate cuts 122*a*, 122*b*, 122*c*, 122*d* may have different widths, e.g., where the widths of two gate cuts (such as gate cuts 122*a* and 122*b*) may differ by at least 1 nm, or at least 2 nm, or at least 4 nm, or at least 6 nm, or at least 8 nm, or at least 10 nm, or at least 12 nm, or at least 15 nm, or at least 20 nm, for example. For example, a wider gate cut may allow passage of conductive power and/or signal vias between a frontside and a backside of the die through the wider gate cut. On the other hand, a narrower gate cut would preserve more space for the gate electrode 118 to wrap around the corresponding nanoribbons 104. In an example, a width of a gate cut (e.g., relative to another gate cut) is implementation specific, and is based on a circuit implemented by the structure 100. In the example of FIG. 1A, each of the gate cuts 122*b* and 122*d* are illustrated to be wider than each of the gate cuts 122*a* and 122*c*.

Note that the gate structure 118*a* is on two corresponding devices, while each of the gate structures 118*b*, 118*c*, 118*d*, 118*e* is on one corresponding device. A number of devices (e.g., one, two, three, or higher) on which a continuous gate structure is may depend on a design or architecture of a circuit implemented by the devices 101, and is implementation specific. In an example, locations and/or a number of gate cuts are implementation specific, and are based on a circuit implemented by the structure 100.

In an example, distances between individual gate cuts and immediate adjacent nanoribbons may differ, as illustrated in FIG. 1A. For example, the gate cut 122*a* is between immediate adjacent nanoribbons 104*b* and nanoribbons 104*c*. The nanoribbons 104*b* are laterally separated from the corresponding gate cut 122*a* by a distance of d1, and the nanoribbons 104*c* are laterally separated from the corresponding gate cut 122*a* by a distance of d2, as illustrated in FIG. 1A. The distances d1 and d2 (and also various other distances d3, . . . , d8 discussed herein below) are along the X-axis direction of FIG. 1A, e.g., through the gate structures 125. Similarly, nanoribbons 104*c* are laterally separated from the adjacent gate cut 122*b* by a distance of d3, the nanoribbons 104*d* are laterally separated from the adjacent gate cut 122*b* by a distance of d4, the nanoribbons 104*d* are laterally separated from the adjacent gate cut 122*c* by a distance of d5, the nanoribbons 104*e* are laterally separated from the adjacent gate cut 122*c* by a distance of d6, the nanoribbons 104*e* are laterally separated from the adjacent gate cut 122*d* by a distance of d7, and the nanoribbons 104*f* are laterally separated from the adjacent gate cut 122*d* by a distance of d8, as illustrated in FIG. 1A.

The example of FIG. 1A illustrates a nominal or target position of the gate cuts 122 with respect to the adjacent nanoribbons 104, e.g., where the edges of the gate cuts are not shifted from their target or intended positions due to any gate cut trench mask placement error (e.g., masks 320, see FIGS. 3B and 3C herein below). In such a scenario, each gate cut is substantially symmetrical with respect to adjacent nanoribbons on both sides. For example, distances d1 and d2 are substantially same, e.g., differs at most by 1 nm or 2 nm. Similarly, distances d3 and d4 are substantially same, e.g., differs at most by 1 nm or 2 nm. Similarly, distances d5 and d6 are substantially same, e.g., differs at most by 1 nm or 2 nm. Similarly, distances d7 and d8 are substantially same, e.g., differs at most by 1 nm or 2 nm.

As illustrated, in an example, distances d2 and d3 are different, e.g., may differ from each other by at least 1 nm, or at least 2 nm, or at least 4 nm, or at least 6 nm, or at least 8 nm, or at least 10 nm, or at least 12 nm, for example. Similarly, distances d4 and d5 are different, e.g., may differ from each other by at least 1 nm, or at least 2 nm, or at least 4 nm, or at least 6 nm, or at least 8 nm, or at least 10 nm, or at least 12 nm, for example. Similarly, distances d6 and d7 are different, e.g., may differ from each other by at least 1 nm, or at least 2 nm, or at least 4 nm, or at least 6 nm, or at least 8 nm, or at least 10 nm, or at least 12 nm, for example.

In an example, one or more of the distances d3, d4, d7, and/or d8 represents a margin for edge placement error (EPE), e.g., a maximum distance by which the edge of the corresponding gate cut can shift, without the gate cut cutting through an adjacent channel region. For example, masks (see FIGS. 3A, 3B, masks 320) are used to form gate cut trenches (e.g., gate cut trenches 310*a*, . . . , 310*d*), where the gate cuts are formed within these trenches. Unintentional shifting of a mask in one direction can result in a corresponding shift in the gate cut trench, and a resultant shift in the corresponding gate cut. Accordingly, a margin of error has maintained, such that even if gate cut trench mask shifts, the gate cut trench may not cut through an adjacent channel region, where the margin of error for mask placement is L (see FIG. 3B) and the margin for EPE is one or more of the distances d3, d4, d7, d8. Note that the distances d1, d2, d5, d6 may be greater than this minimum margin of error.

Thus, even for the nominal or target placement of the gate cuts 122 illustrated in FIG. 1A (e.g., without any unintentional shift of the gate cut mask placement), individual gate cuts are not placed at similar distances from adjacent channel regions. For example, the gate cut 122*b* may be wider than the gate cut 122*a* (e.g., for reasons described above). Accordingly, instead of increasing a lateral distance between nanoribbons 104*c* and nanoribbons 104*d* (e.g., by making the nanoribbons 104*c* and/or 104*d* less wider and/or by making the overall structure 100 wider), the lateral spacing between the gate cut 122*b* and adjacent nanoribbons 104*c* and 104*d* are decreased.

FIG. 1C illustrates cross-sectional view of another integrated circuit structure 100*c* that is at least in part similar to the integrated circuit structure 100 of FIGS. 1A and 1, and where a gate cut 122*a*' of the structure 100*c* of FIG. 1C is placed asymmetrically between nanoribbons 104*b* and 104*c* of two laterally adjacent devices 101*b*, 101*c*, respectively, according to an embodiment of the present disclosure.

The integrated circuit structures 100 and 100*c* are at least in part similar, and similar components are illustrated using similar labels. For example, similar to the structure 100, the structure 100*c* comprises devices 101*a*, . . . , 101*f*, each device 101 comprising corresponding nanoribbons 104 and corresponding source and drain regions (although the source or drain regions are not visible in the view of FIG. 1C).

Also, similar to the structure 100, the structure 100*c* comprises gate cuts 122*a*', 122*b*', 122*c*', and 122*d*', where the positions of the gate cuts 122*a*', 122*b*', 122*c*', and 122*d*' in the structure 100*c* are different from the corresponding positions of the gate cuts 122*a*, 122*b*, 122*c*, and 122*d* in the structure 100.

For example, the distances d1, . . . , d8 are replaced by corresponding distances d1', . . . d8' in FIG. 1C. Note that relative to the positions of the gate cuts 122 in the structure 100 of FIG. 1A, in the structure 100*c* of FIG. 1C, the gate cuts 122*a*' and 122*c*' are shifted unintentionally (e.g., due to technical limitations in placing masks 320 for forming gate cut trenches) towards the right, and the gate cut 122*b*' is shifted unintentionally towards the left.

Accordingly, the distances d1' and d2' are now different, e.g., may differ from each other by at least 1 nm, or at least 2 nm, or at least 4 nm, or at least 6 nm, or at least 8 nm, or at least 10 nm, or at least 12 nm, for example. Similarly, the distances d3' and d4' are now different, e.g., may differ from each other by at least 1 nm, or at least 2 nm, or at least 4 nm, or at least 6 nm, or at least 8 nm, or at least 10 nm, or at least 12 nm, for example. Similarly, the distances d5' and d6' are now different, e.g., may differ from each other by at least 1 nm, or at least 2 nm, or at least 4 nm, or at least 6 nm, or at least 8 nm, or at least 10 nm, or at least 12 nm, for example.

Thus, in the example of FIG. 1C, the nanoribbons are not placed symmetrically around the gate cuts 122. Or put differently, the gate cuts 122 are not formed to be symmetric between the various nanoribbons 104. For example, the gate cut 122*a* is placed asymmetrically between the nanoribbons 104*b* and nanoribbons 104*c*.

FIG. 1D illustrates cross-sectional view of yet another integrated circuit structure 100*d* that is at least in part similar to the integrated circuit structure 100 of FIGS. 1A and 1B, and where positions of various gate cuts 122*a*", 122*b*", 122*c*", 122*d*" relative to the nanoribbons in the structure 100*d* of FIG. 1D are different from positions of corresponding gate cuts 122*a*, 122*b*, 122*c*, 122*d* relative to the nanoribbons in the structure 100 of FIGS. 1A and 1B, such that at least one of the gate cuts (e.g., gate cut 122*b*") of the structure 100*d* of FIG. 1D is in contact with gate dielectric surrounding the nanoribbons 104*c* of an adjacent device 101*c*, according to an embodiment of the present disclosure.

The integrated circuit structures 100 and 100*d* are at least in part similar, and similar components are illustrated using similar labels. For example, similar to the structure 100, the structure 100*d* comprises devices 101*a*, . . . , 101*f*, each device 101 comprising corresponding nanoribbons 104 and corresponding source and drain regions (although the source or drain regions are not visible in the view of FIG. 1D).

Also, similar to the structure 100, the structure 100*d* comprises gate cuts 122*a*", 122*b*", 122*c*", and 122*d*", where the positions of the gate cuts relative to the nanoribbons in the structure 100*d* are different from the corresponding positions of the gate cuts relative to the nanoribbons in the structure 100. For example, in the structure 100*d* of FIG. 1D, the one or more gate cuts (such as the gate cuts 122*b*" and/or 122*d*") are shifted to an extent such that at least one of the gate cuts (such as the gate cuts 122*b*" and/or 122*d*") now is in contact with the gate dielectric 116 wrapping around a stack of nanoribbons. For example, the gate cut 122*b*" is in contact with the gate dielectric 116*c* wrapping around middle sections of the nanoribbons 104*c*, and the gate cut 122*d*" is in contact with the gate dielectric 116*e* wrapping around middle sections of the nanoribbons 104*e*, as illustrated. Thus, the gate dielectric 116*c* around the nanoribbons 104*c* is in contact with the dielectric material 124 of the gate cut 122*b*", and/or the gate dielectric 116*e* around the nanoribbons 104*e* is in contact with the dielectric material 124 of the gate cut 122*d*", as illustrated.

Thus, for example, the gate electrode 118*b* may be absent between the gate dielectric 116*c* and the dielectric material 124 of the gate cut 122*b*", and hence, the gate electrode 118*b* may only partially wrap around the nanoribbons 104*c*. Additionally (or alternatively), the gate electrode 118*d* may be absent between the gate dielectric 116*e* and the dielectric material 124 of the gate cut 122*d*", and hence, the gate electrode 118*d* may only partially wrap around the nanoribbons 104*e*.

Figure 1E:
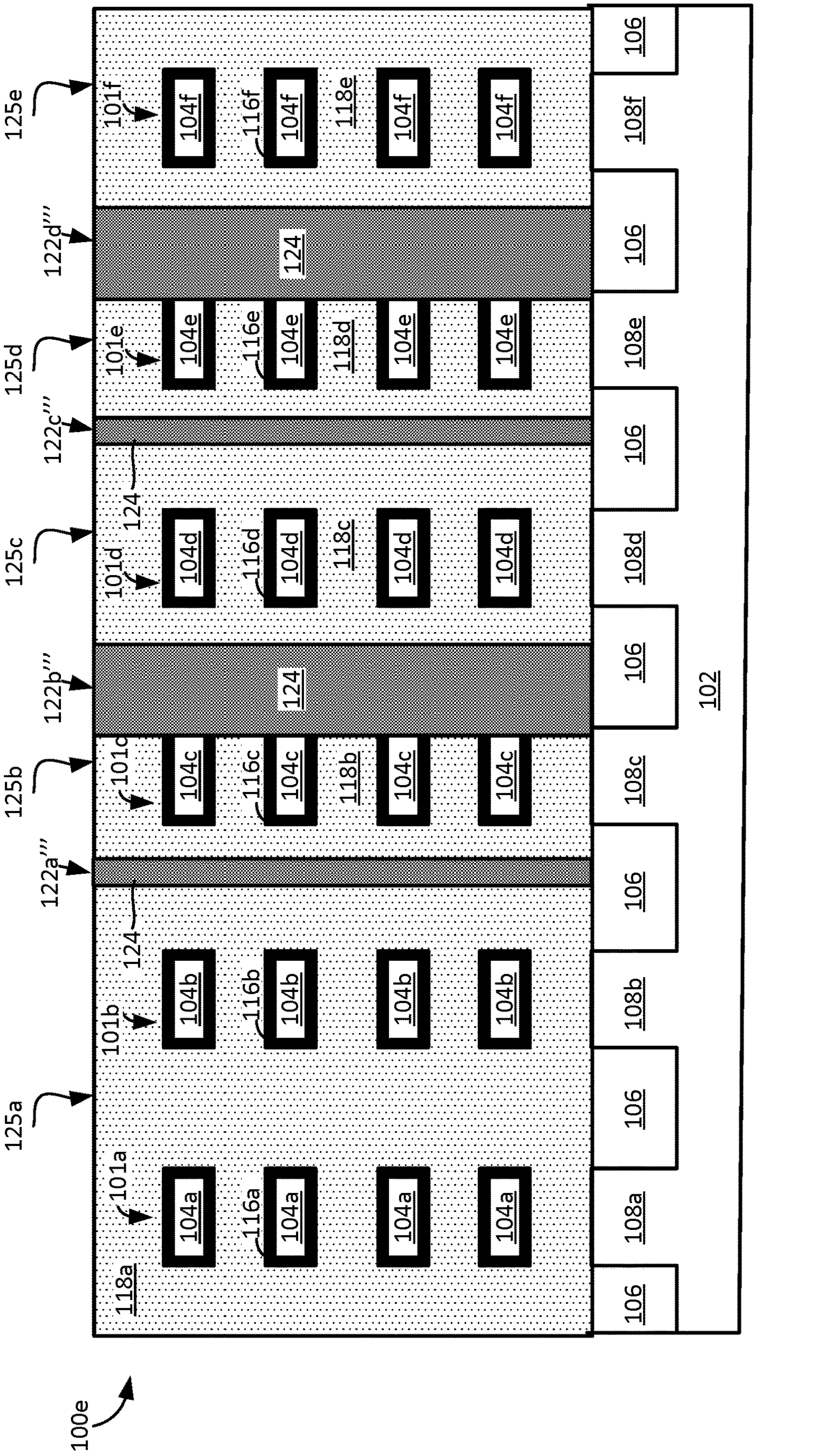
FIG. 1E illustrates cross-sectional view of yet another integrated circuit structure that is at least in part similar to the integrated circuit structure of FIGS. 1A and 1B, and where positions of various gate cuts relative to the nanoribbons in the structure of FIG. 1E are different from positions of corresponding gate cuts relative to the nanoribbons in the structure of FIG. 1A, such that at least one of the gate cuts of the structure of FIG. 1E is in contact with a channel region of an adjacent device, according to an embodiment of the present disclosure.

FIG. 1E illustrates cross-sectional view of yet another integrated circuit structure 100*e* that is at least in part similar to the integrated circuit structure 100 of FIGS. 1A and 1B, and where positions of various gate cuts 122*a*'", 122*b*'", 122*c*'", 122*d*'" relative to the nanoribbons in the structure 100*e* of FIG. 1E are different from positions of corresponding gate cuts 122*a*, 122*b*, 122*c*, 122*d* relative to the nanoribbons in the structure 100 of FIGS. 1A and 1B, such that at least one of the gate cuts (e.g., gate cut 122*b*'") of the structure 100*e* of FIG. 1E is in contact with a channel region (such as a nanoribbon 104*c*) of an adjacent device 101*c*, according to an embodiment of the present disclosure.

The integrated circuit structures 100 and 100*e* are at least in part similar, and similar components are illustrated using similar labels. For example, similar to the structure 100, the structure 100*e* comprises devices 101*a*, . . . , 101*f*, each device 101 comprising corresponding nanoribbons 104 and corresponding source and drain regions (although the source or drain regions are not visible in the view of FIG. 1E).

Also, similar to the structure 100, the structure 100*e* comprises gate cuts 122*a*''', 122*b*''', 122*c*''', and 122*d*''', where the positions of the gate cuts 122*a*''', 122*b*''', 122*c*''', and 122*d*''' relative to the nanoribbons in the structure 100*e* are different from the corresponding positions of the gate cuts 122*a*, 122*b*, 122*c*, and 122*d* relative to the nanoribbons in the structure 100. For example, in the structure 100*e* of FIG. 1E, the gate cuts are shifted to an extent such that at least one of the gate cuts now is in contact with the adjacent nanoribbons.

For example, the gate cut 122*b*''' is in contact with the nanoribbons 104*c*, such that tips or end sections of the nanoribbons 104*c* are exposed to and in contact with the dielectric material 124 of the gate cut 122*b*'''. Similarly, the gate cut 122*d*''' is in contact with the nanoribbons 104*e*.

Thus, for example, the gate electrode 118*b* and the gate dielectric 116*c* may be absent between the nanoribbons 104*c* and the dielectric material 124 of the gate cut 122*b*''', and hence, the gate electrode 118*b* and/or the gate dielectric 116*c* may only partially wrap around individual nanoribbons 104*c*. Additionally (or alternatively), the gate electrode 118*d* and the gate dielectric 116*e* may be absent between the nanoribbons 104*e* and the dielectric material 124 of the gate cut 122*d*''', and hence, the gate electrode 118*d* and/or the gate dielectric 116*e* may only partially wrap around individual nanoribbons 104*e*.

Now comparing FIGS. 1A and 1E, the gate cut 122*b* of FIG. 1A has shifted to the left by the distance d3 in FIG. 1E, and as a result, the gate cut 122*b*''' of FIG. 1E is in contact with the nanoribbons 104*c*. Similarly, the gate cut 122*d* of FIG. 1A has shifted to the left by the distance d7 in FIG. 1E, and as a result, the gate cut 122*d*''' of FIG. 1E is in contact with the nanoribbons 104*e*.

For example, as described above with respect to FIG. 1A, the distances d3, d4, d7, and/or d8 represented the margin of error for placement of gate cut edges, referred herein as edge placement error (EPE) margin. FIG. 1E illustrates an extreme example in which the gate cuts 122*b*, 122*d* shifted the entire extent of the EPE margin, such that the gate cuts 122*b*''', 122*d*''' of FIG. 1E are now in contact with the adjacent nanoribbons 104*c* and 104*e*.

Referring now to the structures 100, 100*c*, 100*d*, and 100*e* of FIGS. 1A-1E, in the structure 100, individual gate cuts 122 is substantially symmetrical with respect to the positions of the adjacent nanoribbons 104. However, the symmetrical placement of the gate cuts 122 (e.g., which may be a target or intended placement) may not be always possible to achieve. For example, there may be error is placement of masks used to form the gate cuts (e.g., see masks 320 of FIGS. 3B-3C discussed herein below). Accordingly, the gate cut masks may be shifted, resulting in the asymmetrically positioned gate cuts of the structures 100*c*, 100*d*, or 100*e* of FIGS. 1C, 1D, and 1E, respectively.

In an example, in a GAA device, for a gate structure 125 to have sufficient control over corresponding nanoribbons 104, the gate electrode 118 (e.g., including the work function material that is part of the gate electrode) of the gate structure 125 may wrap around the middle portions of individual nanoribbons 104. For example, as illustrated in FIGS. 1A and 1C, the gate electrode 118*b* of the gate structure 125*b* wraps around middle sections of individual ones of the nanoribbons 104*c*. However, in the structures 100*d* and 100*e*, the gate electrode 118*b* of the gate structure 125*b* does not completely wrap around middle sections of individual ones of the nanoribbons 104*c*, thereby reducing the control of the gate structure on the corresponding nanoribbons.

However, in an example, the gate electrode being on one or more sides of the nanoribbons may be sufficient to impart enough gate control on the channel regions of the devices 101. For example, in each of FIGS. 1A, 1C, 1D, and 1E, the gate electrode 118*b* is on one or more sides (e.g., at least on three sides) of the nanoribbons 104*c*. For example, in FIGS. 1D and 1E, the gate electrode 118*b* is not on all four sides (e.g., does not completely wrap around), but is on three sides of individual nanoribbons 104*c*, which may be sufficient to impart enough control on the channel regions (e.g., comprising the nanoribbons 104*c*) for satisfactory operation of the device 101*c*.

Thus, although FIG. 1A illustrates a symmetrical (and maybe a target or ideal) placement of the gate cuts 122, the asymmetrical gate cut placement of each of FIGS. 1C, 1D and 1E may also be acceptable for satisfactory operation of the devices 101*a*, . . . , 101*f*. Accordingly, even if the target gate cut placement of FIG. 1A is not achieved due to gate cut mask placement error, any of the resultant structures 100*c*, 100*d*, or 100*e* of FIG. 1C, 1D, or 1E may also be acceptable for satisfactory operations of the devices 101*a*, . . . , 101*f*.

This results in relatively large acceptable margin of error for gate cut edge placement. For example, edges of the margin of error for placement of the masks for the gate cut is made to be sufficiently close to the adjacent channel regions (e.g., see margin of error L in FIG. 3B, or distances d3, d4, d7, d8 of FIG. 1A), such that the gate cut may now be shifted to be arbitrarily close to (or even in contact with) the channel regions of an immediate adjacent device. The additional headroom resulting from the acceptable margin of error for gate cut mask placement can be used to make the cross-sectional width w1 of the nanoribbons 104 (see FIG. 1A for width w1) relatively large. That is, now the channel width w1 can be made relatively large (e.g., wider channels), as the error margin for the gate cut mask placement (and consequently the error margin for the gate cut edge placement) is now relatively large, e.g., extends up to an edge of the channel regions (e.g., edges of the nanoribbons 104). Put differently, there is no reason to have sufficient or threshold lateral gap between each nanoribbon and an adjacent gate cut, and hence, the channel regions comprising the nanoribbons 104 can now be made wider, resulting in greater drive current and lower capacitance, leading to improved performance of the devices 101.

Figure 2:
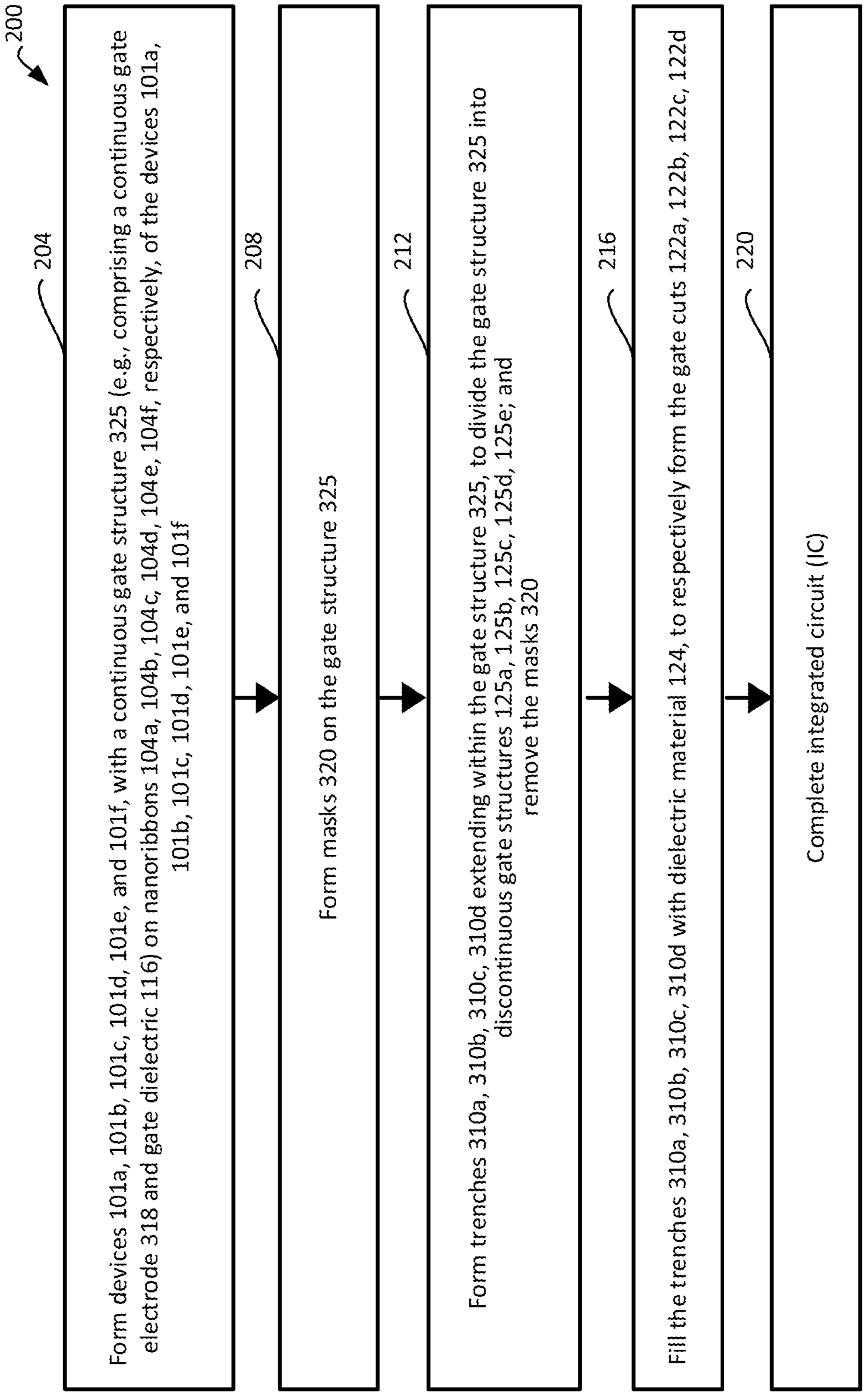
FIG. 2 illustrates a flowchart depicting a method of forming the integrated circuit structures of FIGS. 1A-1E, in accordance with an embodiment of the present disclosure.

FIG. 2 illustrates a flowchart depicting a method 200 of forming the integrated circuit structures of FIGS. 1A-1E, in accordance with an embodiment of the present disclosure. FIGS. 3A, 3B, 3C, 3D, and 3E collectively illustrate cross-sectional views of an integrated circuit structure in various stages of processing in accordance with the methodology 200 of FIG. 2, in accordance with an embodiment of the present disclosure. FIGS. 2 and 3A-3E will be discussed in unison.

Referring to FIG. 2, the method 200 includes, at 204, forming devices 101*a*, 101*b*, 101*c*, 101*d*, 101*e*, and 101*f*, with a continuous gate structure 325 (e.g., comprising a continuous gate electrode 318 and gate dielectric 116) on nanoribbons 104*a*, 104*b*, 104*c*, 104*d*, 104*e*, 104*f*, respectively, of the devices 101*a*, 101*b*, 101*c*, 101*d*, 101*e*, and 101*f*, e.g., as illustrated in FIG. 3A. In an example, the devices 101*a*, . . . , 101*f* having the common and continuous gate structure 325 are formed using appropriate techniques for forming laterally adjacent transistors, such as transistors that are GAA transistors (e.g., having nanoribbons or nanosheets or nanowires as channel regions) or that has fin-based channel regions. Note that FIG. 3A illustrates an example in which the nanoribbons 104 form the channel regions of the devices 101*a*, . . . , 101*f*, although the devices can have other types of channel regions discussed above. As illustrated in FIG. 3A, the gate structure 325 comprises the common and continuous gate electrode 318, and gate dielectric 116 on individual nanoribbons 104, where the gate dielectric 116 separates the gate electrode 318 from the nanoribbons 104.

Referring again to FIG. 2, the method 200 then proceeds from 204 to 208, where masks 320*a*, 320*b*, 320*c*, 320*d*, 320*e* are formed on the gate structure 325, as illustrated in FIG. 3B. For example, the masks 320 are formed on areas of the gate structure 325 that are not to be removed for formation of the gate cuts 122.

Note the length L between a right edge of the nanoribbons 104*b* and the left edge of the nanoribbons 104*c*. The mask 320*a* is placed such that a right edge of the mask 320*a* is within this length L. Put differently, the length L indicates a margin of error for placement of the right edge of the mask 320*a*, so as to avoid placing the right edge of the mask 320*a* above the nanoribbons 104*b* or 104*c*. Similarly, the length L also indicates a margin of error for placement of the left edge of the mask 320*b*, so as to avoid placing the left edge of the mask 320*b* above the nanoribbons 104*b* or 104*c*. Thus, edges of the margin of error L for placement of the masks for the gate cut is made to be sufficiently close to the adjacent channel regions (e.g., overlapping with edges of the channel regions, see FIG. 3B), such that the gate cut may now be shifted to be arbitrarily close (e.g., even in contact with, as discussed with respect to FIG. 1E) to the channel regions of an immediate adjacent device.

Thus, the masks 320*a* and/or 320*b* may be shifted slightly towards left or right from the target positions of these masks, as long as the right edge of the mask 320*a* and the left edge of the mask 320*b* are within the margin L. Due to the relatively large margin of error L for mask placement, the width w1 (see FIG. 1A) of the channel regions 104 may now be made relatively large, resulting in the various performance benefits discussed herein above. The other masks 320*c*, 320*d*, 320*e* may have similar margin of error in placement of these masks.

In an example, the masks 320 may comprise an appropriate material that is etch selective to the material of the gate electrode 318 (e.g., an etch process to etch the gate electrode 318 may not substantially etch the masks 320, and an etch process to etch the masks 320 may not substantially etch the gate electrode 318). The masks 320 comprise carbon hard mask (CHM) or silicon nitride, for example.

Figure 3C:
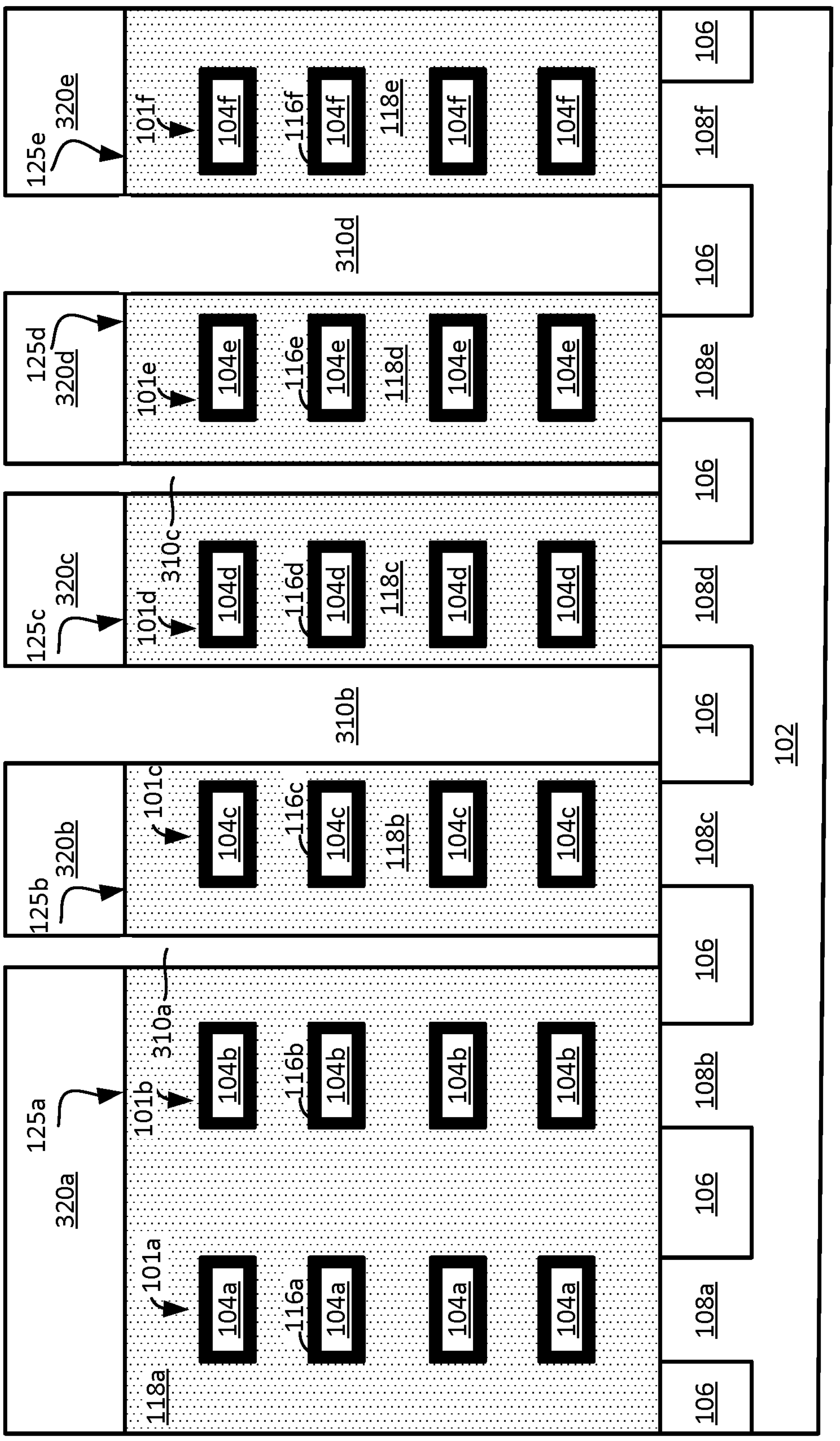

Referring again to FIG. 2, the method 200 then proceeds from 208 to 212, where trenches 310*a*, 310*b*, 310*c*, 310*d* extending within the gate structure 325 are formed, as illustrated in FIG. 3C. The trenches 310*a*, 310*b*, 310*c*, 310*d* divide the gate structure 325 into discontinuous and separate gate structures 125*a*, 125*b*, 125*c*, 125*d*, 125*e*, as illustrated. For example, an appropriate etch process may be employed to form the trenches. The metal gate etch process iteratively etches through portions of gate electrode 325 not covered by the masks 320, to form the gate cut trenches 310*a*, 310*b*, 310*c*, 310*d*. The masks 320 protects the gate structures 125*a*, 125*b*, 125*c*, 125*d*, 125*e* from being etched, while the trenches 310*a*, 310*b*, 310*c*, 310*d* are being formed through uncovered sections of the gate electrode 318. The dielectric fill 106 may act as an etch stop layer for the etch process. Also, at 212, subsequent to forming the trenches 310*a*, 310*b*, 310*c*, 310*d*, the masks 320*a*, 320*b*, 320*c*, 320*d*, 320*e* are removed, e.g., by employing an appropriate etch process, as illustrated in FIG. 3D.

Figure 3E:
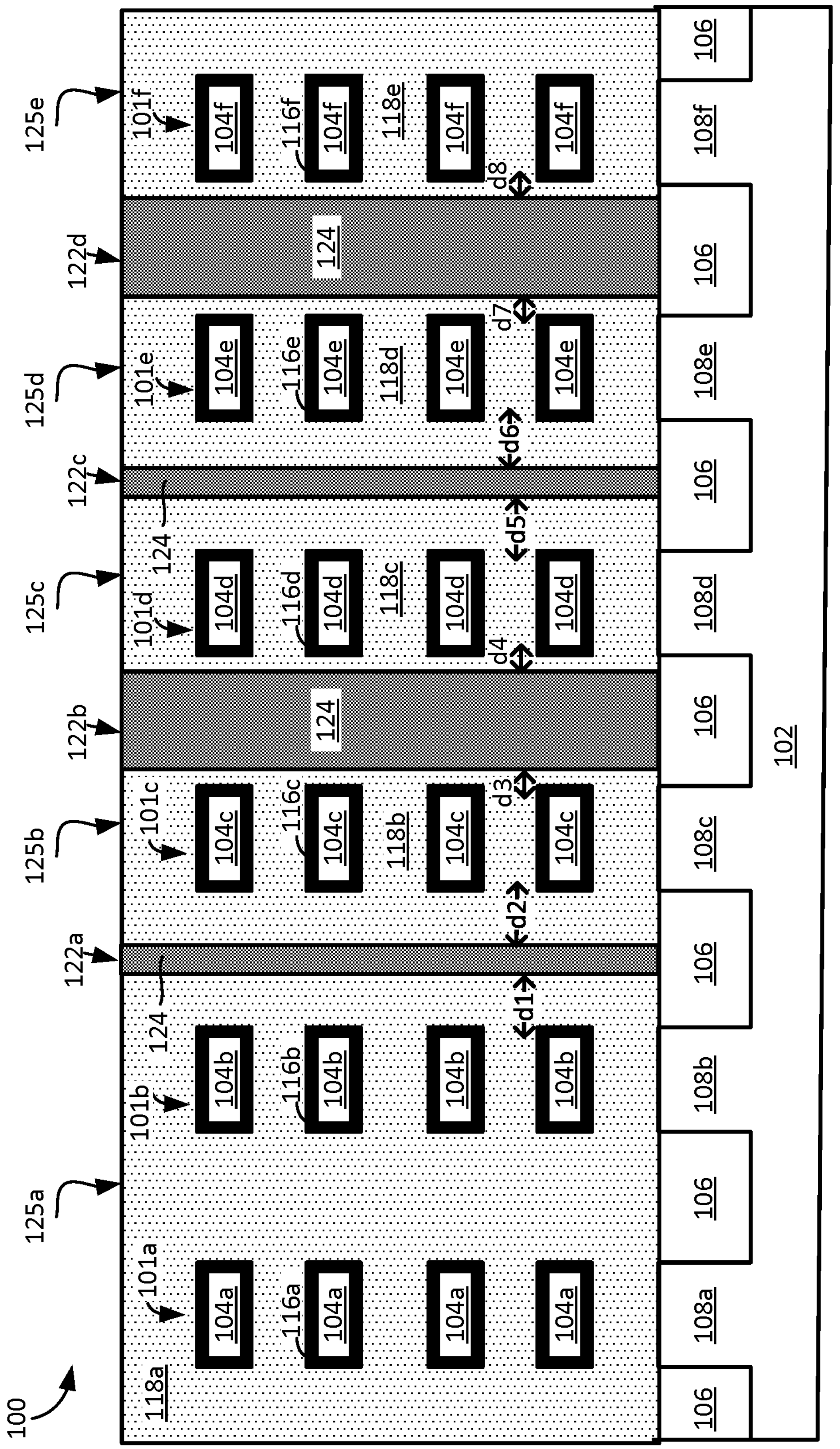

Referring again to FIG. 2, the method 200 then proceeds from 212 to 216, where the trenches 310*a*, 310*b*, 310*c*, 310*d* are filled with dielectric material 124, to respectively form the gate cuts 122*a*, 122*b*, 122*c*, 122*d*, as illustrated in FIG. 3E. According to some embodiments, a top surface of the dielectric material 124 may be polished using, for example, chemical mechanical polishing (CMP). The top surface of dielectric material 124 may be polished until it is substantially planar with a top surface of the gate electrodes 118. As described above, gate cuts 122*a*, 122*b*, 122*c*, 122*d* may include one or more layers or bodies of dielectric material, such as the example case of one or more dielectric liner layers generally defining the gate cut perimeter, and one or more additional layers to fill the gate cut recess. In some cases, the gate cuts 122*a*, 122*b*, 122*c*, 122*d* may include one or more air gaps.

Note that the position of the masks 320 in FIGS. 3B and 3C, and resultant positions of the gate cuts 122*a*, 122*b*, 122*c*, 122*d* in FIG. 3E result in formation of the structure 100 of FIG. 1A. However, in another example, the masks 320, and consequently the trenches 310*a*, 310*b*, 310*c*, 310*d* and further consequently the gate cuts 122*a*, 122*b*, 122*c*, 122*d* may be shifted, to form any of the structures 100*c*, 100*d*, or 100*e* of FIG. 1C, 1D, or 1E, respectively. For example, as discussed, the mask placement error margin is given by the length L in FIG. 3B, and in an extreme scenario where the right edge of the mask 320*a* is shifted all the way above the right edge of the nanoribbons 104*b*, the structure 100*e* of FIG. 1E is formed.

Referring again to the method 200 of FIG. 2, the method 200 proceeds from 216 to 220. At 220, a general integrated circuit (IC) is completed, as desired, in accordance with some embodiments. Such additional processing to complete an IC may include formation of conductive gate, source and/or drain contacts, back-end or back-end-of-line (BEOL) processing to form one or more metallization layers and/or to interconnect the transistor devices formed, for example. Any other suitable processing may be performed, as will be apparent in light of this disclosure.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

Example System

Figure 4:
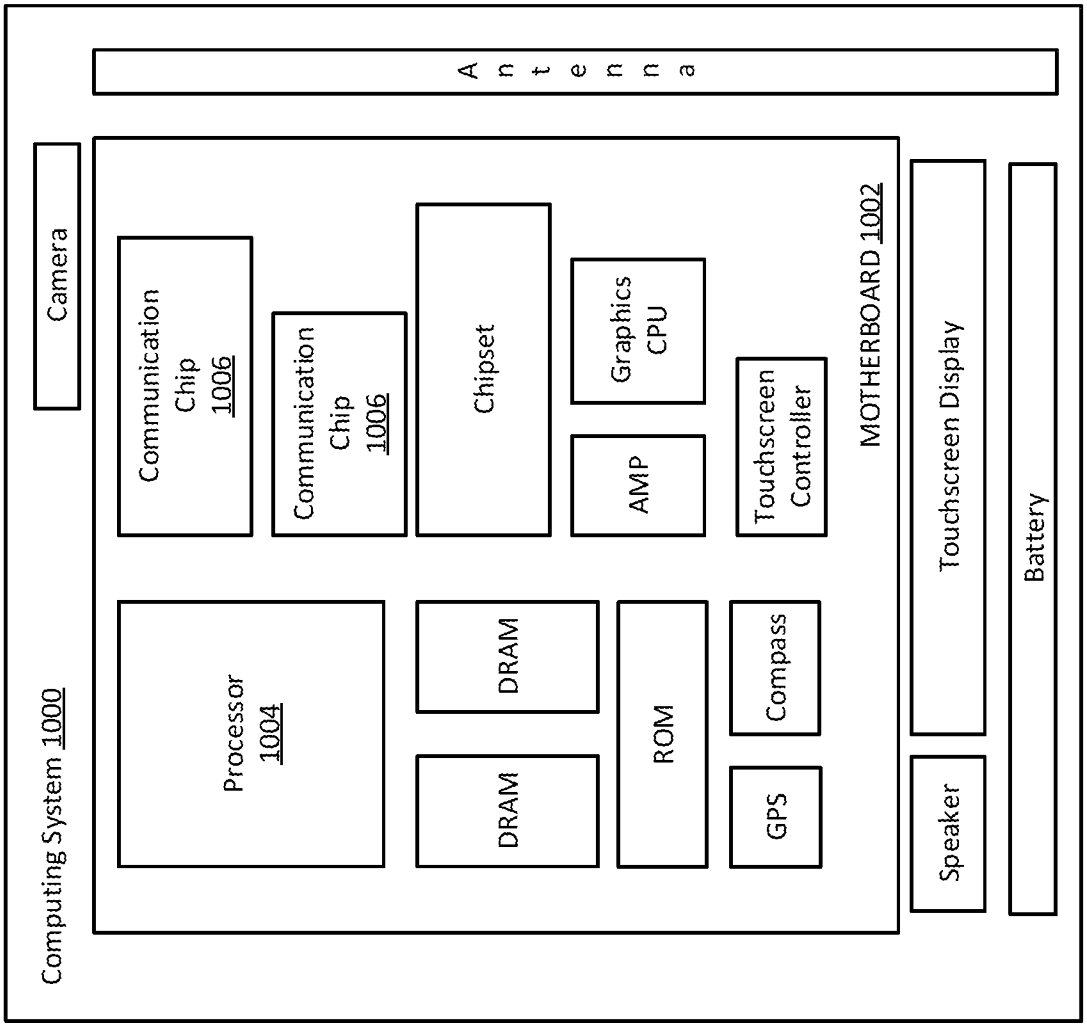
FIG. 4 illustrates a computing system implemented with integrated circuit structures (such as the integrated circuit structures illustrated in FIGS. 1A-1E) formed using the techniques disclosed herein, in accordance with some embodiments of the present disclosure.

FIG. 4 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit comprising: a first semiconductor device comprising (i) a first source region, (ii) a first drain region, (iii) a first body comprising semiconductor material extending in a first direction from the first source region to the first drain region, and (iv) a first gate structure extending in a second direction and on the first body; a second semiconductor device comprising (i) a second source region, (ii) a second drain region, (iii) a second body comprising semiconductor material extending in the first direction from the second source region to the second drain region, and (iv) a second gate structure extending in the second direction and on the second body; and a gate cut laterally between and separating the first gate structure and the second gate structure, the gate cut comprising dielectric material; wherein the first body is separated laterally from the gate cut by a first distance, wherein the second body is separated laterally from the gate cut by a second distance, and wherein the first and second distances differ by at least 2 nanometers (nm).

Example 2. The integrated circuit of example 1, wherein there is no other semiconductor device between the first semiconductor device and the gate cut, and between the second semiconductor device and the gate cut.

Example 3. The integrated circuit of any one of examples 1-2, wherein: the first gate structure comprises (i) a gate electrode, and (ii) a gate dielectric on the first body, the gate dielectric separating the gate electrode from the first body; and the gate dielectric, and not the gate electrode, is laterally between the first body and the dielectric material of the gate cut.

Example 4. The integrated circuit of any one of examples 1-3, wherein the first distance is zero, such that the first body is in contact with the dielectric material of the gate cut.

Example 5. The integrated circuit of any one of examples 1-3, wherein: the first gate structure comprises (i) a gate electrode, and (ii) gate dielectric between the gate electrode and the first body; and the gate dielectric is in contact with the dielectric material of the gate cut.

Example 6. The integrated circuit of any one of examples 1-5, wherein: the first gate structure comprises (i) a gate electrode, and (ii) gate dielectric between the gate electrode and the first body; and no portion of the gate electrode is laterally between at least a section of the first body and the dielectric material of the gate cut.

Example 7. The integrated circuit of any one of examples 1-6, wherein the dielectric material of the gate cut comprises silicon and oxygen.

Example 8. The integrated circuit of any one of examples 1-7, wherein the gate cut is a first gate cut, and wherein the integrated circuit further comprises: a third semiconductor device comprising (i) a third source region, (ii) a third drain region, (iii) a third body comprising semiconductor material extending in the first direction from the third source region to the third drain region, and (iv) a third gate structure extending in the second direction and on the third body, wherein the second semiconductor device is laterally between the first and third semiconductor devices; and a second gate cut laterally between and separating the second gate structure and the third gate structure, the second gate cut comprising the dielectric material, wherein there is no other semiconductor device between the second semiconductor device and the second gate cut; wherein the second body is separated laterally from the second gate cut by a third distance, and wherein the second and third distances differ by at least 2 nm.

Example 9. The integrated circuit of example 8, wherein the first gate cut has a first width measured in the second direction, the second gate cut has a second width measured in the second direction, and the first and second widths differ by at least 2 nm.

Example 10. The integrated circuit of any one of examples 1-9, wherein at least one of the first or second distances is less than 2 nm.

Example 11. The integrated circuit of any one of examples 1-10, wherein the first and second distances differ by at least 4 nm.

Example 12. The integrated circuit of any one of examples 1-11, wherein each of the first and second bodies is a nanoribbon, a nanowire, or a nanosheet.

Example 13. The integrated circuit of any one of examples 1-11, wherein each of the first and second bodies is a fin.

Example 14. The integrated circuit of any one of examples 1-12, wherein the first device comprises: a plurality of bodies arranged in a vertical stack and comprising semiconductor material, the plurality of bodies extending in the first direction from the first source region to the first drain region, the plurality of bodies including the first body, wherein the first gate structure at least in part wraps around middle portions of each body of the plurality of bodies, and wherein the plurality of bodies comprises a plurality of nanoribbons, a plurality of nanowires, or a plurality of nanosheets.

Example 15. The integrated circuit of any one of examples 1-14, wherein the first distance is measured along the second direction and through the first gate structure, and the second distance is measured along the second direction and through the second gate structure.

Example 16. A printed circuit board comprising the integrated circuit of any one of examples 1-15.

Example 17. An integrated circuit comprising: a semiconductor device comprising (i) a source region, (ii) a drain region, (iii) a body comprising semiconductor material extending laterally from the source region to the drain region, and (iv) a gate structure on the body; and a first gate cut and a second gate cut, each of the first and second gate cuts comprising dielectric material, wherein the gate structure is laterally between and in contact with the first and second gate cuts; wherein no other semiconductor device is laterally between the semiconductor device and the first gate cut, and laterally between the semiconductor device and the second gate cut; wherein the body is separated laterally from (i) the first gate cut by a first distance and (ii) the second gate cut by a second distance; and wherein the first and second distances differ by at least 2 nanometers (nm).

Example 18. The integrated circuit of example 17, wherein the first and second distances differ by at least 4 nm.

Example 19. The integrated circuit of any one of examples 17-18, wherein the gate structure comprises (i) a gate electrode, and (ii) gate dielectric between the gate electrode and the body, and wherein the gate dielectric is in contact with the dielectric material of one of the first or second gate cuts.

Example 20. The integrated circuit of any one of examples 17-19, wherein the gate structure comprises (i) a gate electrode, and (ii) gate dielectric between the gate electrode and the body, and wherein the gate electrode in part wraps around a middle section of the body, and the gate electrode is absent laterally between at least a section of the body and the dielectric material of one of the first or second gate cuts.

Example 21. The integrated circuit of any one of examples 17-20, wherein the body is a nanoribbon, a nanowire, a nanosheet, or a fin.

Example 22. An integrated circuit comprising: a first device including a first body comprising semiconductor material, and a second device including a second body comprising semiconductor material, wherein the first and second devices include a first gate structure that is on both the first body and the second body; a third device including (i) a third body comprising semiconductor material, and (ii) a second gate structure on the third body; a fourth device including (i) a fourth body comprising semiconductor material, and (ii) a third gate structure on the fourth body, wherein the first gate structure is laterally between the second and third gate structures; a first structure comprising dielectric material laterally between the first and second gate structures, wherein there is no intervening device laterally between the first device and the first structure; and a second structure comprising dielectric material laterally between the first and third gate structures, wherein there is no intervening device laterally between the second device and the second structure; wherein the first body is separated laterally from the first structure by a first distance and the second body is separated laterally from the second structure by a second distance; and wherein the first and second distances differ by at least 2 nanometers (nm).

Example 23. The integrated circuit of example 22, further comprising: a fifth device laterally between the first device and the second device, wherein the fifth device includes a fifth body comprising semiconductor material, and wherein the first gate structure is on the fifth body.

Example 24. The integrated circuit of any one of examples 22-23, wherein: the third body is separated laterally from the first structure by a third distance, and the fourth body is separated laterally from the second structure by a fourth distance; and the first and third distances differ by at least 2 nm, and/or the second and fourth distances differ by at least 2 nm.

Example 25. A printed circuit board comprising the integrated circuit of any one of examples 22-24.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit comprising:

a first semiconductor device comprising (i) a first source region, (ii) a first drain region, (iii) a first body comprising semiconductor material extending in a first direction from the first source region to the first drain region, and (iv) a first gate structure extending in a second direction and on the first body;

a second semiconductor device comprising (i) a second source region, (ii) a second drain region, (iii) a second body comprising semiconductor material extending in the first direction from the second source region to the second drain region, and (iv) a second gate structure extending in the second direction and on the second body;

a third semiconductor device comprising (i) a third source region, (ii) a third drain region, (iii) a third body comprising semiconductor material extending in the first direction from the third source region to the third drain region, and (iv) a third gate structure extending in the second direction and on the third body, wherein the second semiconductor device is laterally between the first and third semiconductor devices;

a first gate cut laterally between and separating the first gate structure and the second gate structure, the first gate cut comprising dielectric material; and a second gate cut laterally between and separating the second gate structure and the third gate structure, the second gate cut comprising the dielectric material, wherein there is no other semiconductor device between the second semiconductor device and the second gate cut;

wherein the first body is separated laterally from the first gate cut by a first distance, wherein the second body is separated laterally from the first gate cut by a second distance, and wherein the second body is separated laterally from the second gate cut by a third distance, the first and second distances differ differing by at least 2 nanometers (nm), and the second and third distances differing by at least 2 nm, and wherein the first gate cut has a first width measured in the second direction, the second gate cut has a second width measured in the second direction, and the first and second widths differ by at least 2 nm.

2. The integrated circuit of claim 1, wherein there is no other semiconductor device between the first semiconductor device and the first gate cut, and between the second semiconductor device and the first gate cut.

3. The integrated circuit of claim 1, wherein:

the first gate structure comprises (i) a gate electrode, and (ii) a gate dielectric on the first body, the gate dielectric separating the gate electrode from the first body; and the gate dielectric, and not the gate electrode, is laterally between the first body and the dielectric material of the first gate cut.

4. The integrated circuit of claim 1, wherein the first distance is zero, such that the first body is in contact with the dielectric material of the first gate cut.

5. The integrated circuit of claim 1, wherein:

the first gate structure comprises (i) a gate electrode, and (ii) gate dielectric between the gate electrode and the first body; and the gate dielectric is in contact with the dielectric material of the first gate cut.

6. The integrated circuit of claim 1, wherein:

the first gate structure comprises (i) a gate electrode, and (ii) gate dielectric between the gate electrode and the first body; and no portion of the gate electrode is laterally between at least a section of the first body and the dielectric material of the first gate cut.

7. The integrated circuit of claim 1, wherein at least one of the first, second, or third distances is less than 2 nm.

8. The integrated circuit of claim 1, wherein the first and second distances differ by at least 4 nm.

9. The integrated circuit of claim 1, wherein each of the first, second, and third bodies is a nanoribbon, a nanowire, or a nanosheet.

10. The integrated circuit of claim 1, wherein each of the first, second, and third bodies is a fin.

11. The integrated circuit of claim 1, wherein the first device comprises:

a plurality of bodies arranged in a vertical stack and comprising semiconductor material, the plurality of bodies extending in the first direction from the first source region to the first drain region, the plurality of bodies including the first body, wherein the first gate structure at least in part wraps around middle portions of each body of the plurality of bodies, and wherein the plurality of bodies comprises a plurality of nanoribbons, a plurality of nanowires, or a plurality of nanosheets.

12. A printed circuit board comprising the integrated circuit of claim 1.

13. An integrated circuit comprising:

a semiconductor device comprising (i) a source region, (ii) a drain region, (iii) a body comprising semiconductor material extending laterally in a first direction from the source region to the drain region, and (iv) a gate structure on the body; and a first gate cut and a second gate cut, each of the first and second gate cuts comprising dielectric material, wherein the gate structure extends laterally in a second direction between and in contact with the first and second gate cuts, and wherein the first gate cut has a first width measured in the second direction, the second gate cut has a second width measured in the second direction, and the first and second widths differ by at least 2 nm;

wherein no other semiconductor device is laterally between the semiconductor device and the first gate cut, and laterally between the semiconductor device and the second gate cut;

wherein the body is separated laterally from (i) the first gate cut by a first distance and (ii) the second gate cut by a second distance; and wherein the first and second distances differ by at least 2 nanometers (nm).

14. The integrated circuit of claim 13, wherein the gate structure comprises (i) a gate electrode, and (ii) gate dielectric between the gate electrode and the body, and wherein the gate dielectric is in contact with the dielectric material of one of the first or second gate cuts.

15. The integrated circuit of claim 13, wherein the gate structure comprises (i) a gate electrode, and (ii) gate dielectric between the gate electrode and the body, and wherein the gate electrode in part wraps around a middle section of the body, and the gate electrode is absent laterally between at least a section of the body and the dielectric material of one of the first or second gate cuts.

16. The integrated circuit of claim 13, wherein the semiconductor device is a first semiconductor device, the integrated circuit further comprising:

a second semiconductor device comprising (i) a second source region, (ii) a second drain region, (iii) a second body comprising semiconductor material extending laterally in the first direction from the second source region to the second drain region, and (iv) a second gate structure on the second body, wherein the second gate cut is laterally between the first semiconductor device and the second semiconductor device and no other semiconductor device is laterally between the second semiconductor device and the second gate cut, wherein the second body is separated laterally from the second gate cut by a third distance, the third distance being at least 2 nm different from each of the first distance and the second distance.

17. An integrated circuit comprising:

a first device including a first body comprising semiconductor material, and a second device including a second body comprising semiconductor material, wherein the first and second devices include a first gate structure that is on both the first body and the second body;

a third device including (i) a third body comprising semiconductor material, and (ii) a second gate structure on the third body;

a fourth device including (i) a fourth body comprising semiconductor material, and (ii) a third gate structure on the fourth body, wherein the first gate structure is laterally between the second and third gate structures;

a first structure comprising dielectric material laterally between the first and second gate structures, wherein there is no intervening device laterally between the first device and the first structure; and a second structure comprising dielectric material laterally between the first and third gate structures, wherein there is no intervening device laterally between the second device and the second structure;

wherein the first structure has a first width and the second structure has a second width, the first and second widths differing by at least 2 nm, wherein the first body is separated laterally from the first structure by a first distance and the second body is separated laterally from the second structure by a second distance; and wherein the first and second distances differ by at least 2 nanometers (nm).

18. The integrated circuit of claim 17, further comprising:

a fifth device laterally between the first device and the second device, wherein the fifth device includes a fifth body comprising semiconductor material, and wherein the first gate structure is on the fifth body.

19. The integrated circuit of claim 17, wherein:

the third body is separated laterally from the first structure by a third distance, and the fourth body is separated laterally from the second structure by a fourth distance; and the first and third distances differ by at least 2 nm, and/or the second and fourth distances differ by at least 2 nm.

20. The integrated circuit of claim 17, wherein the first distance is zero, such that the first body is in contact with the dielectric material of the first structure.

* * * * *